(12) United States Patent
Kudoh et al.

(10) Patent No.: US 6,384,436 B1
(45) Date of Patent: May 7, 2002

(54) PHOTOELECTRIC TRANSDUCER AND SOLID-STATE IMAGE SENSING DEVICE USING THE SAME

(75) Inventors: Yoshiharu Kudoh; Akihito Tanabe, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/453,170

(22) Filed: Dec. 2, 1999

(30) Foreign Application Priority Data

Dec. 4, 1998 (JP) .......................................... 10-344776

(51) Int. Cl.[7] .......................................... H01L 27/148
(52) U.S. Cl. ...................... 257/231; 257/232; 257/233; 438/48
(58) Field of Search ................................ 257/232, 231, 257/233; 438/48

(56) References Cited

U.S. PATENT DOCUMENTS

| 4,724,470 | A | * | 2/1988 | Van Santen et al. | 357/24 |
| 5,432,363 | A | * | 7/1995 | Kamisaka et al. | 257/233 |
| 5,668,390 | A | * | 9/1997 | Morimoto | 257/232 |
| 5,736,756 | A | * | 4/1998 | Wakayama et al. | 257/223 |
| 5,744,831 | A | * | 4/1998 | Tanaka | 257/225 |
| 5,844,264 | A | * | 12/1998 | Shinji | 257/223 |
| 5,929,470 | A | * | 7/1999 | Harada et al. | 257/233 |
| 6,025,210 | A | * | 2/2000 | Matsuda et al. | 438/60 |

FOREIGN PATENT DOCUMENTS

| JP | 57-62557 | 4/1982 |
| JP | 1-232761 | 9/1989 |
| JP | 2-253658 | 10/1990 |
| JP | 4-11774 | 1/1992 |
| JP | 8-130299 | 5/1996 |

* cited by examiner

*Primary Examiner*—Tom Thomas
*Assistant Examiner*—Donghee Kang
(74) *Attorney, Agent, or Firm*—Whitham, Curtis & Christofferson P.C.

(57) ABSTRACT

Disclosed is a photoelectric transducer having a photodiode that is formed on a second-conductivity-type well and is composed of a first-conductivity-type region to accumulate signal charge when light is supplied and a first second-conductivity-type region formed on the first-conductivity-type region. The first second-conductivity-type region is separated from a second-conductivity-type device separation region and is connected to the second-conductivity-type device separation region at part of the circumference of the first second-conductivity-type region through a second second-conductivity-type region that is formed to be at least partially shallower than the first second-conductivity-type region. Also, disclosed is a solid-state image sensing device equipped with the photoelectric transducer.

23 Claims, 25 Drawing Sheets

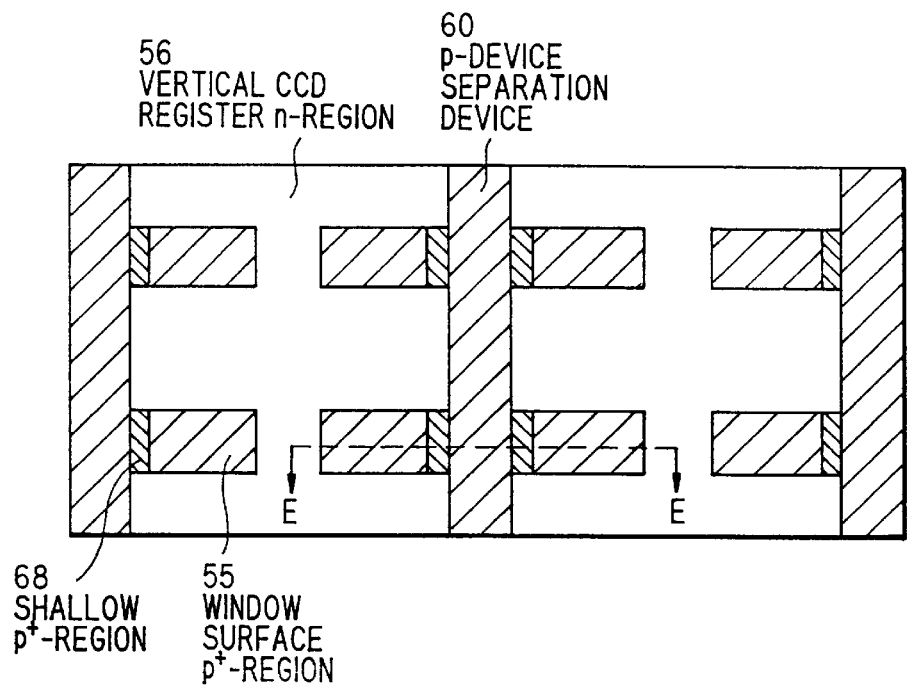
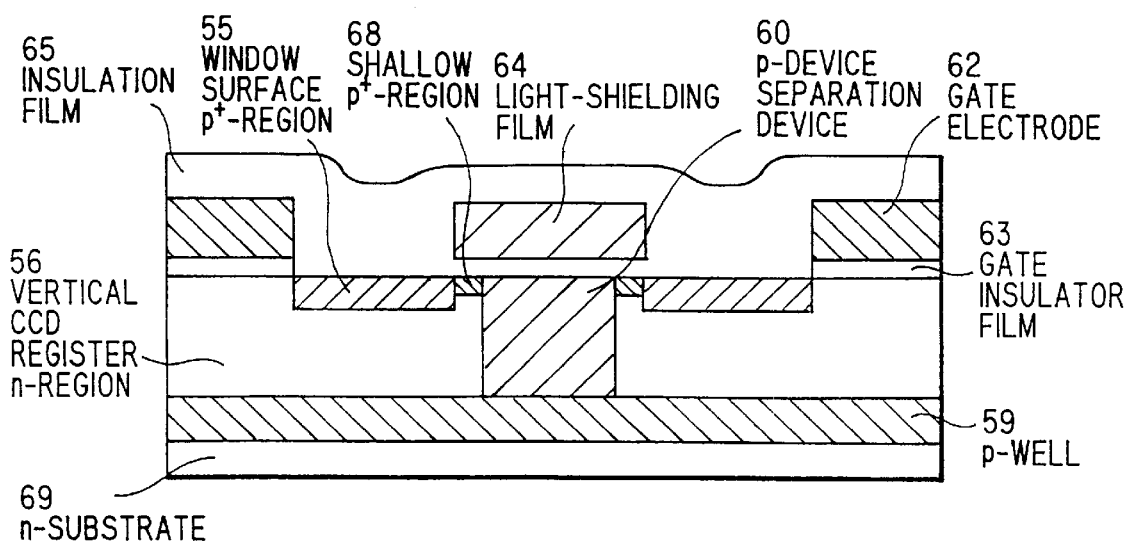

PHOTOELECTRIC TRANSDUCER AND SOLID-STATE IMAGE SENSING DEVICE USING THE SAME

FIELD OF THE INVENTION

This invention relates to a photoelectric transducer and a solid-state image sensing device using the photoelectric transducer, and more particularly to, a solid-state image sensing device in which smear or crosstalk is reduced.

BACKGROUND OF THE INVENTION

Typical solid-state image sensing devices using CCD have an interline transfer type two-dimensional CCD solid-state image sensing device and a buried photodiode structure. This is described in, for example, Japanese patent application laid-open No. 57-62557 (1982).

FIG. 1A is a plan view showing an interline transfer type two-dimensional CCD solid-state image sensing device, and FIG. 1B is a cross sectional view cut along the line F—F in FIG. 1A. In this type of solid-state image sensing device, many photodiodes 1 to generate signal charge by the incidence of light are arrayed. A vertical CCD register 2 is provided for each row of photodiodes. One end of the vertical CCD register 2 is connected to a horizontal CCD register 3, which is connected to an output section 4. The photodiode and the vertical CCD register are formed on a n-well 9 formed on a n-substrate 19. The photodiode is composed of n-region 6 to accumulate signal charge and $p^+$-region the surface. The vertical CCD register is composed of n-well 7 and p-well 8. Between the photodiode and vertical CCD register, there is $p^+$-device separation region 10 or p-region 11 forming a transfer gate. At the upper part of the vertical CCD register, there is provided a gate electrode 12 to apply drive pulse voltage through gate insulator film 13 to the vertical CCD register. Further on the gate electrode 12, light-shielding film 14 is formed sandwiching insulation film 15, and thereby light-generated charge can be prevented from occurring in the vertical CCD register. The whole surface is covered with insulation film 15. The transfer gate is controlled by the gate electrode 12 of vertical CCD register. When positive voltage is applied to the gate electrode, signal charge moves from the n-accumulation region 6 through a channel formed at the transfer gate to the n-well 7.

Here, the end of $p^+$-region 5 adjacent to the transfer gate and on the surface of photodiode is separated from the p-region 11 so as to make signal charge easy to read out from the n-accumulation region 6 to the n-well 7 of vertical CCD register. Thus, the n-region 6 is formed between the $p^+$-region 5 and the p-region 11.

Also, a solid-state image sensing device called frame transfer type other than the interline transfer type is known. The frame transfer type solid-state image sensing device is characterized by its high numerical aperture.

FIG. 2 is a plan view showing a frame transfer type two-dimensional CCD solid-state image sensing device. Different from the interline transfer type, its vertical CCD register functions as both transfer section and light-receiving section. One end of multiple rows of vertical CCD registers 51 is connected to a horizontal CCD register 52, which is connected to output section 53. The occurrence of charge by the incidence of light is performed in the vertical CCD register. In the frame transfer type, since the incidence of light is performed through the gate electrode of vertical CCD register, the sensitivity of the short-wavelength component is not good. Therefore, by providing the vertical CCD register 2 with a window 54 with no gate electrode on its top, the sensitivity of the short-wavelength component can be enhanced.

FIG. 3 is an enlarged view showing the pixel region. Gate electrodes 71 to 74 are periodically disposed in the transfer direction and windows 54 are formed therebetween. The gate electrodes in FIG. 3 are of single layer, but maybe of multiple layers. Light-shielding film 64 to prevent the crosstalk is formed over the gate electrode between pixels. The light-shielding film 64 is connected to the gate electrode by the contact and may be also used as electric interconnection.

FIG. 4A is a schematic plan view showing the surface of substrate below the gate electrode. FIG. 4B is a cross sectional view cut along the line G—G in FIG. 4A. The n-region 56 is formed below the gate electrode, and p-device separation region 60 is formed below the light-shielding film 64. Also, p-well 59 is formed on n-substrate 69, and n-well 56 is further formed thereon. The n-well 56 is a charge accumulation region for the incidence of light and is also used as a transfer section. In the opening section (window), $p^+$-region 55 is formed on the n-well 56. In the transfer section, a gate electrode 62 to which the drive voltage pulse of CCD is applied through gate insulator film 63 is formed. The p-device separation region 60 is formed between pixels, and light-shielding film 64 is formed sandwiching insulation film 65 thereon. Also, the whole surface is covered with insulation film 65.

In the CCD image sensing device, cell area per one pixel continues to reduce, according to an increase in pixel number and a reduction in device size. In the interline transfer type CCD image sensing device, the distance between the light-receiving section and the transfer section shortens with the reduction of cell area. Therefore, there is a problem that even when the transfer gate is turned off, smear is likely to flow into the transfer section beyond the device separation region. Such smear occurs especially when light with high luminance is supplied. In the buried photodiode structure disclosed in Japanese patent application No. 57-062557 (1982), the smear component due to diffusion of signal charge to generate in the semiconductor substrate becomes an issue. The diffusion-caused smear explained below, referring to the drawings.

FIG. 5 is an enlarged cross sectional view showing the end of $p^+$-region 5 on the side of the $p^+$-device separation region 10 in FIG. 1B. When light is supplied to the image-sensing device, signal charge due to the photoelectric conversion occurs in the surface $p^+$-region 5 and n-accumulation region 6 of the photodiode. Most of the signal charge that occurs in the surface $p^+$-region 5 moves to the n-accumulation region 6. But, part of the light-generated charge occurring at the $p^+$-region 5 near the end of the light-shielding film 14 passes through near the surface of the $p^+$-device separation region 10, then flows into n-well 7 of vertical CCD register to cause a smear.

The same phenomenon is also seen in the case of frame transfer type CCD image-sensing device. In this case, the window incurs crosstalk.

FIG. 6 is an enlarged cross sectional view showing the vicinity of the device separation region of the frame transfer type CCD image-sensing device in FIG. 4B. Signal charge generated in the surface $p^+$-region 55 of the window's end where light-shielding film 64 opens by the incidence of light passes through the $p^+$-device separation region 60, flowing into then-region 56 for the neighboring pixel to affect the sensitivity of that pixel.

Methods of reducing the diffused smear component have been suggested. For example, Japanese patent application No. 08-130299 (1996) discloses a structure that surface p$^+$-region 25 of photodiode and device separation region 30 are connected by p$^{++}$-region 38 with high concentration of impurity as shown in FIG. 7A. In FIG. 7A, the composition except the surface p$^+$-region 25 of photodiode and device separation region 30 is the same as that in FIG. 1B. For this composition, the potential distribution of a cross section cut along the line H—H is shown in FIG. 7B. According to this method, since the potential barrier is formed by built-in voltage by the difference of impurity concentration, the possibility that signal charge comes into a smear component due to the diffusion can be reduced.

However, due to insufficient height of potential barrier, there exists charge to flow into n-well of vertical CCD register. Therefore, it is impossible to reduce the smear to a large extent.

On the other hand, Japanese patent application No. 04-11774 discloses a structure that insulator is buried into device separation region to block the path of signal charge to cause smear. However, in this case, the device characteristic must deteriorate due to the mechanical stress while the smear can be reduced to a large extent.

SUMMARY OF THE INVENTION

Accordingly, it is an object of the invention to provide a photoelectric transducer and a solid-state image sensing device that can reduce the smear or crosstalk.

According to the invention, a photoelectric transducer, comprises:

a photodiode that is formed on a second-conductivity-type well and is composed of a first-conductivity-type region to accumulate signal charge when light is supplied and a second-conductivity-type region formed on the first-conductivity-type region;

wherein the second-conductivity-type region except part where the potential of the second-conductivity-type region is grounded is separated from a second-conductivity-type device separation region by the first-conductivity-type region.

According to another aspect of the invention, a solid-state image sensing device, comprises:

a photoelectric transducer comprising a photodiode that is formed on a second-conductivity-type well and is composed of a first-conductivity-type region to accumulate signal charge when light is supplied and a second-conductivity-type region formed on the first-conductivity-type region, wherein the second-conductivity-type region except part where the potential of the second-conductivity-type region is grounded is separated from a second-conductivity-type device separation region by the first-conductivity-type region; and a signal-charge transfer section or signal line that is connected through a transfer gate to the photodiode;

wherein the second-conductivity-type device separation region is provided in a region except the transfer gate between the photodiode and the signal-charge transfer section or signal line.

According to another aspect of the invention, a solid-state image sensing device, comprises:

(a) plurality of light-receiving units that are arrayed on a second-conductivity-type well and are composed of a first-conductivity-type region to accumulate signal charge when light is supplied and a second-conductivity-type region formed on the first-conductivity-type region, wherein the second-conductivity-type region except part where the potential of the second-conductivity-type region is grounded is separated from a second-conductivity-type device separation region that is formed between the light-receiving units by the first-conductivity-type region.

According to another aspect of the invention, a photoelectric transducer, comprises:

a photodiode that is formed on a second-conductivity-type well and is composed of a first-conductivity-type region to accumulate signal charge when light is supplied and a first second-conductivity-type region formed on the first-conductivity-type region;

wherein the first second-conductivity-type region is separated from a second-conductivity-type device separation region and is connected to the second-conductivity-type device separation region at part of the circumference of the first second-conductivity-type region through a second second-conductivity-type region that is formed to be at least partially shallower than the first second-conductivity-type region.

According to another aspect of the invention, a solid-state image sensing device, comprises:

a photodiode that is formed on a second-conductivity-type well and is composed of a first-conductivity-type region to accumulate signal charge when light is supplied and a first second-conductivity-type region formed on the first-conductivity-type region; wherein the first second-conductivity-type region is separated from a second-conductivity-type device separation region and is connected to the second-conductivity-type device separation region at part of the circumference of the first second-conductivity-type region through a second second-conductivity-type region that is formed to be at least partially shallower than the first second-conductivity-type region; and a signal-charge transfer section or signal line that is connected through a transfer gate to the photodiode;

wherein the second-conductivity-type device separation region is provided in a region except the transfer gate between the photodiode and the signal-charge transfer section or signal line.

According to another aspect of the invention, a solid-state image sensing device, comprises:

a plurality of light-receiving units that are arrayed on a second-conductivity-type well and are composed of a first-conductivity-type region to accumulate signal charge when light is supplied and a first second-conductivity-type region formed on the first-conductivity-type region, wherein the first second-conductivity-type region is separated from a second-conductivity-type device separation region and is connected to the second-conductivity-type device separation region at part of the circumference of the first second-conductivity-type region through a second second-conductivity-type region that is formed to be at least partially shallower than the first second-conductivity-type region.

For example, when the invention is applied to a CCD solid-state image sensing device, signal charge occurred at p$^+$-region on the surface of photodiode and forwarding to adjacent vertical CCD register or photodiode flows from n-region to separate the p$^+$-region and p$^+$-device separation region into n-accumulation region. Therefore, false signal charge to cause the smear or crosstalk can be prevented from reaching the adjacent vertical CCD register or photodiode. Also, by providing shallow p$^+$-region between the surface p$^+$-region and p$^+$-device separation region, the same effect can be obtained.

Meanwhile, a photoelectric transducer in the invention can be applied not only to a CCD solid-state image sensing device but also to a MOS type solid-state image sensing device. In the MOS type solid-state image sensing device, signal line for transmitting signal charge is provided substituting for the vertical CCD register. Thus, according to the invention, false signal charge from photodiode to signal line can be reduced like the case of CCD solid-state image sensing device.

BRIEF DESCRIPTION OF THE DRAWINGS

The invention will be explained in more detail in conjunction with the appended drawings, wherein:

FIG. 27A is a plan view showing the pixel region of a frame transfer type CCD image sensing device in a fourth preferred embodiment according to the invention, FIG. 27B is a cross sectional view cut along the line E—E in FIG. 27A.

DESCRIPTION OF THE PREFERRED EMBODIMENTS

<First Embodiment>

Figure 1A:
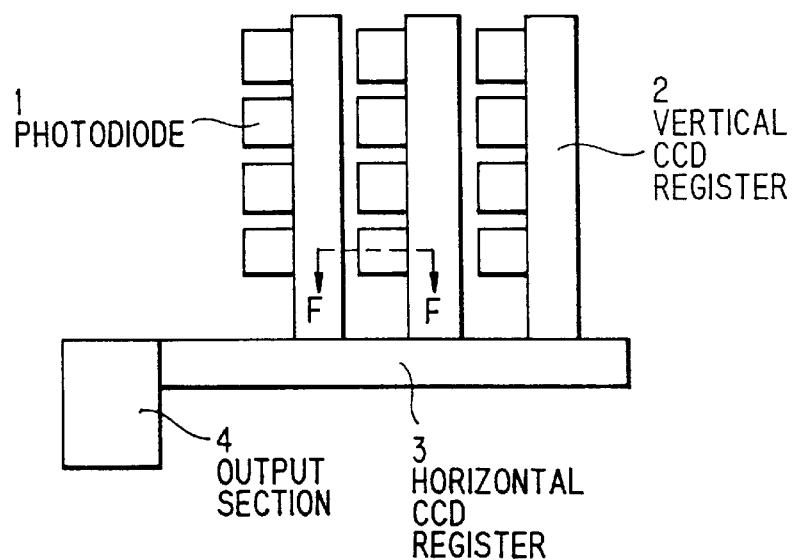
FIG. 1A is a plan view showing the conventional interline transfer type CCD image sensing device.
Figure 1B:
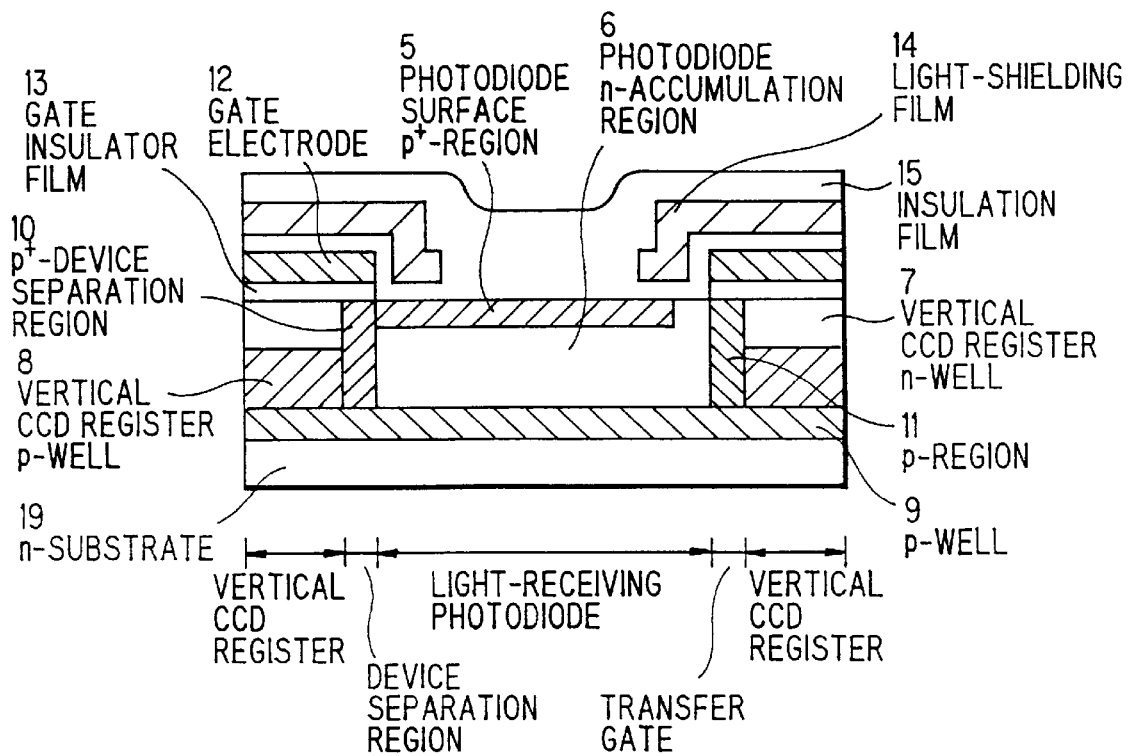
FIG. 1B is a cross sectional view cut along the line F—F in FIG. 1A.
Figure 2:
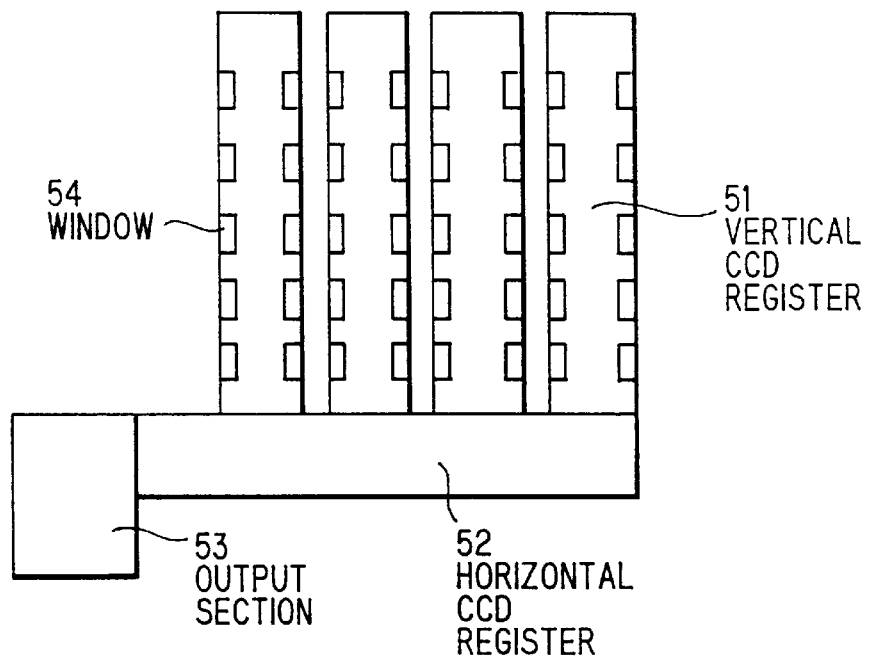
FIG. 2 is a plan view showing the conventional frame transfer type CCD image sensing device.
Figure 3:
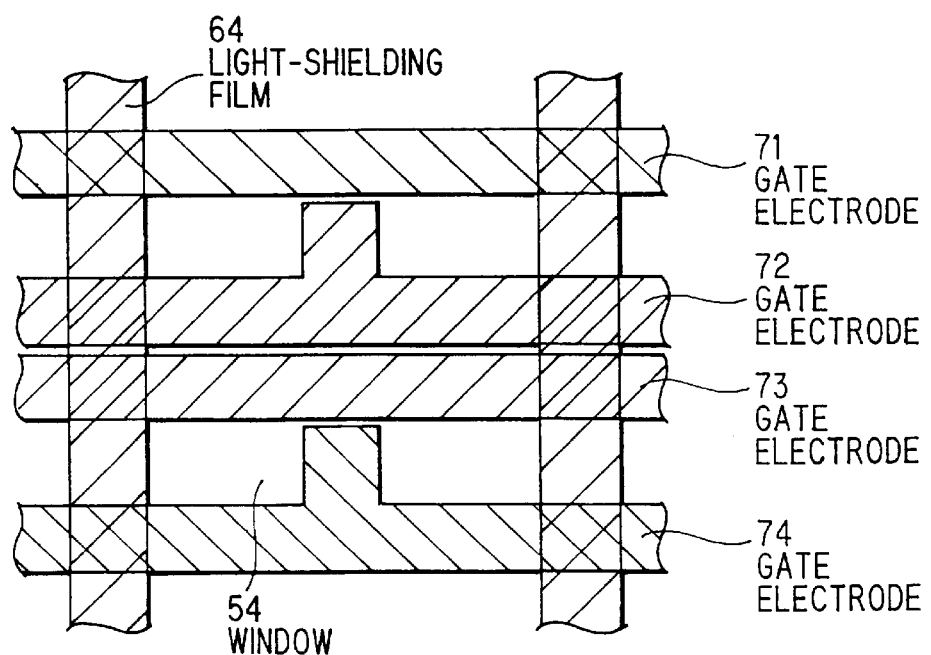
FIG. 3 is an enlarged plan view showing the pixel region of the conventional frame transfer type CCD image sensing device.
Figure 4A:
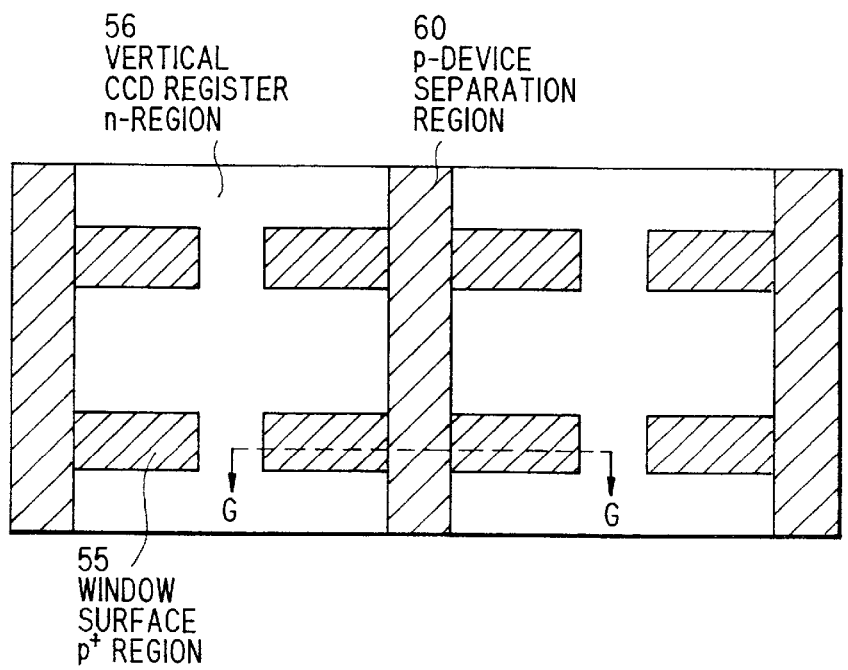
FIG. 4A is a plan view showing the surface of substrate in the conventional frame transfer type CCD image sensing device.
Figure 4B:
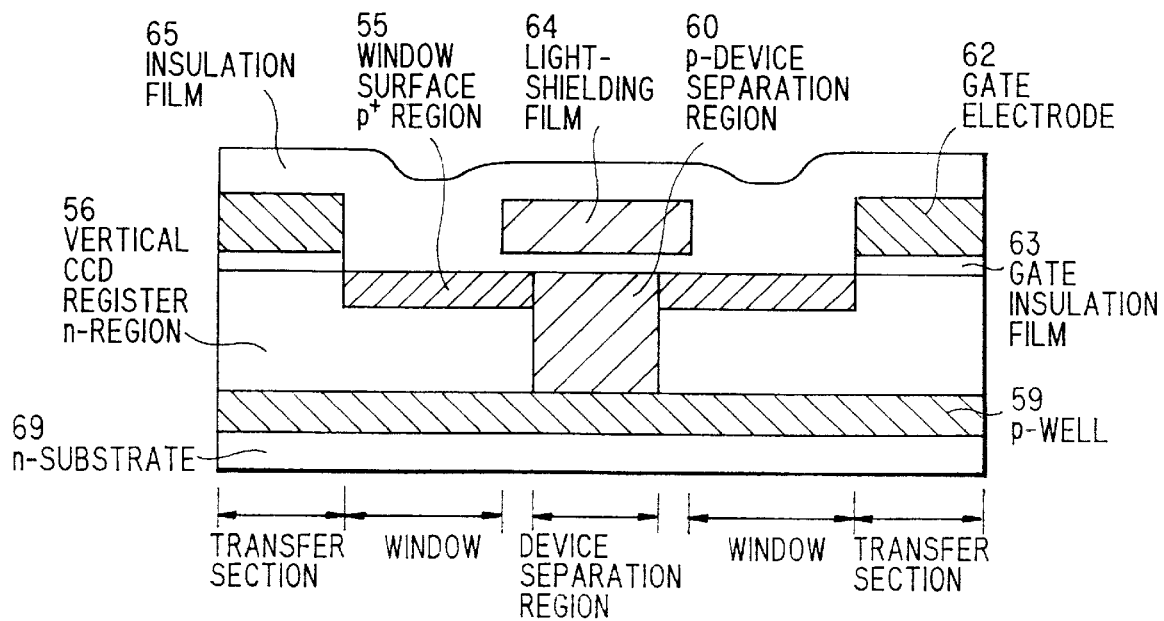
FIG. 4B is a cross sectional view cut along the line G—G in FIG. 4A.
Figure 5:
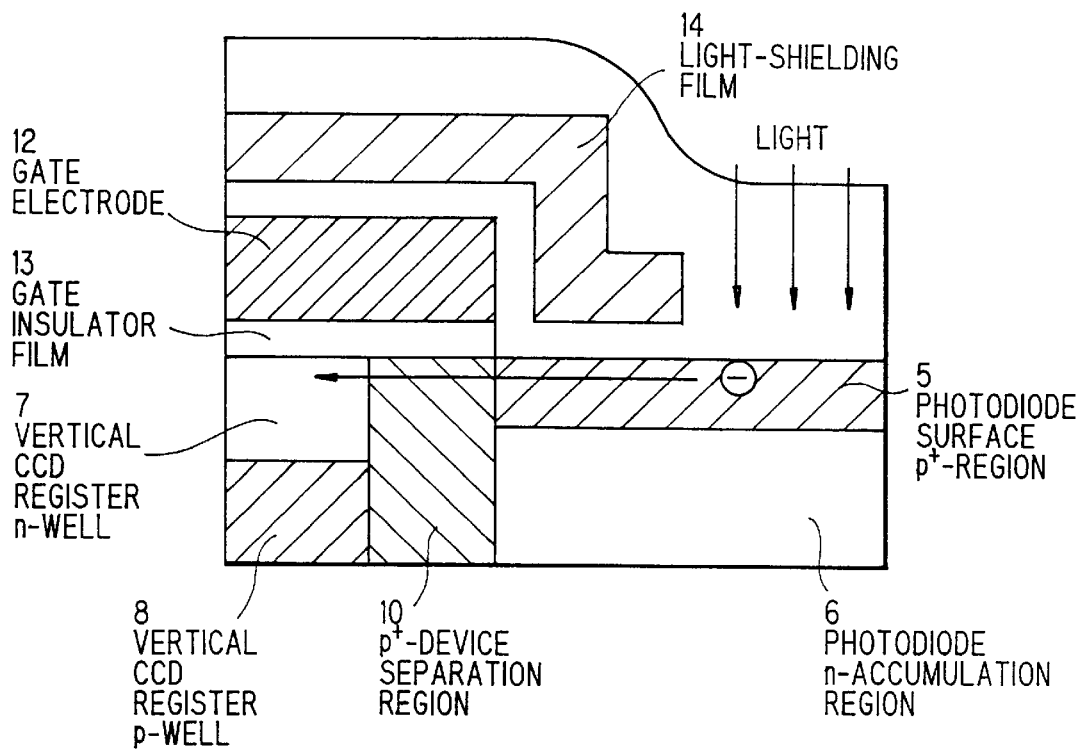
FIG. 5 is a cross sectional view showing the occurrence of smear in the conventional interline transfer type CCD image sensing device.
Figure 6:
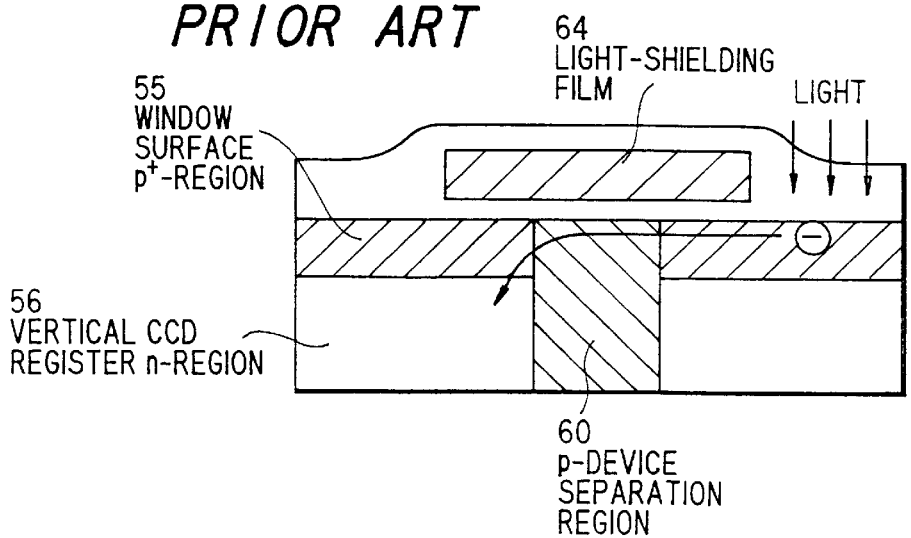
FIG. 6 is a cross sectional view showing the occurrence of crosstalk in the conventional frame transfer type CCD image sensing device.
Figure 7A:
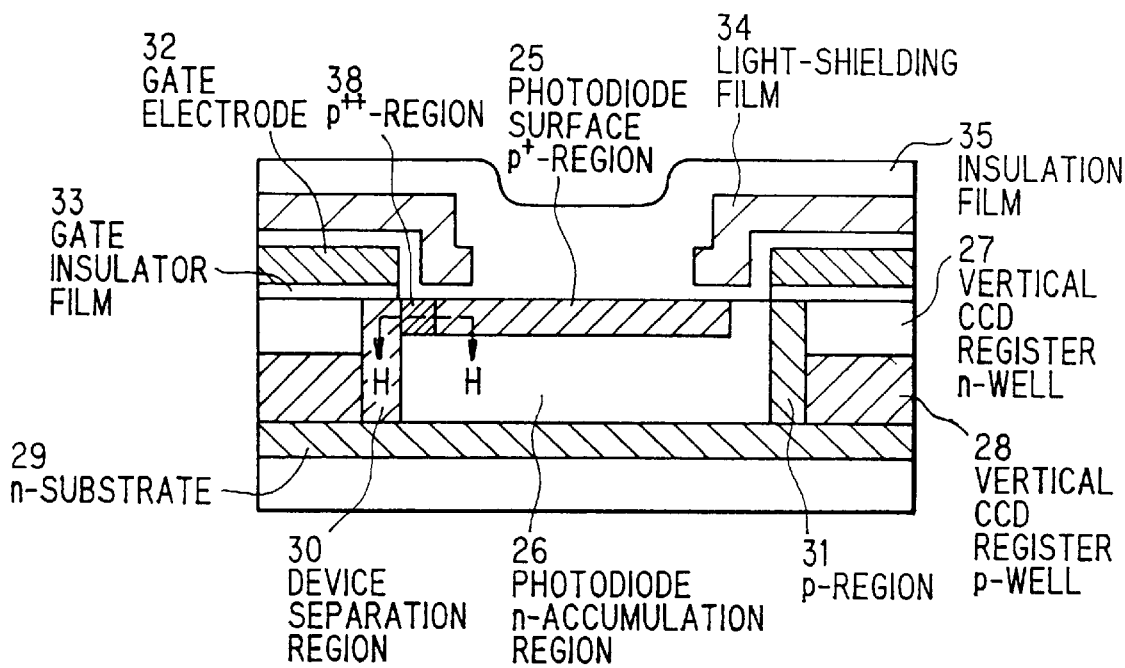
FIG. 7A is a cross sectional view showing the conventional interline transfer type CCD image sensing device in Japanese patent application No. 8-130299.
Figure 7B:
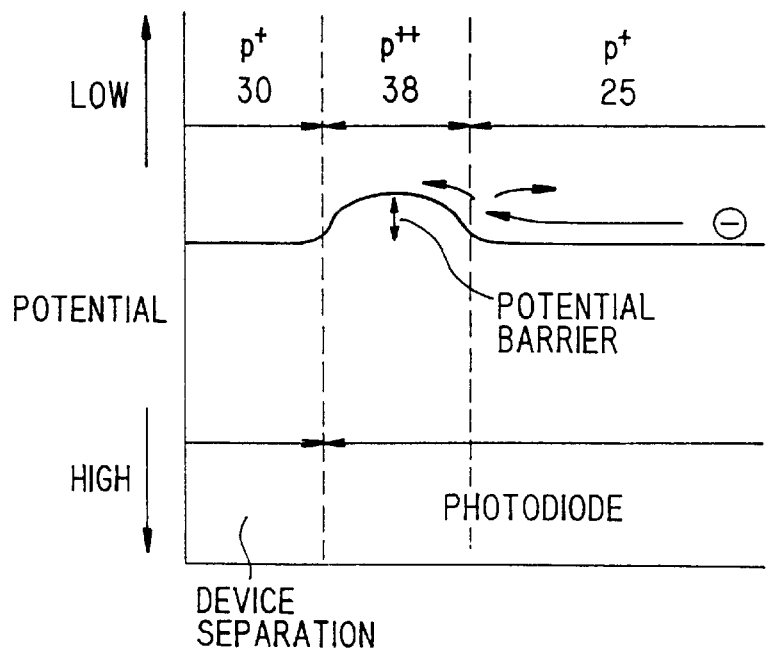
FIG. 7B is a graph showing the potential distribution in cross section cut along the line H—H in FIG. 7A.

The first preferred embodiment of the invention is explained below. Meanwhile, in the drawings below, like parts are indicated by like numerals used in FIGS. 1 to 7B.

Figure 8A:
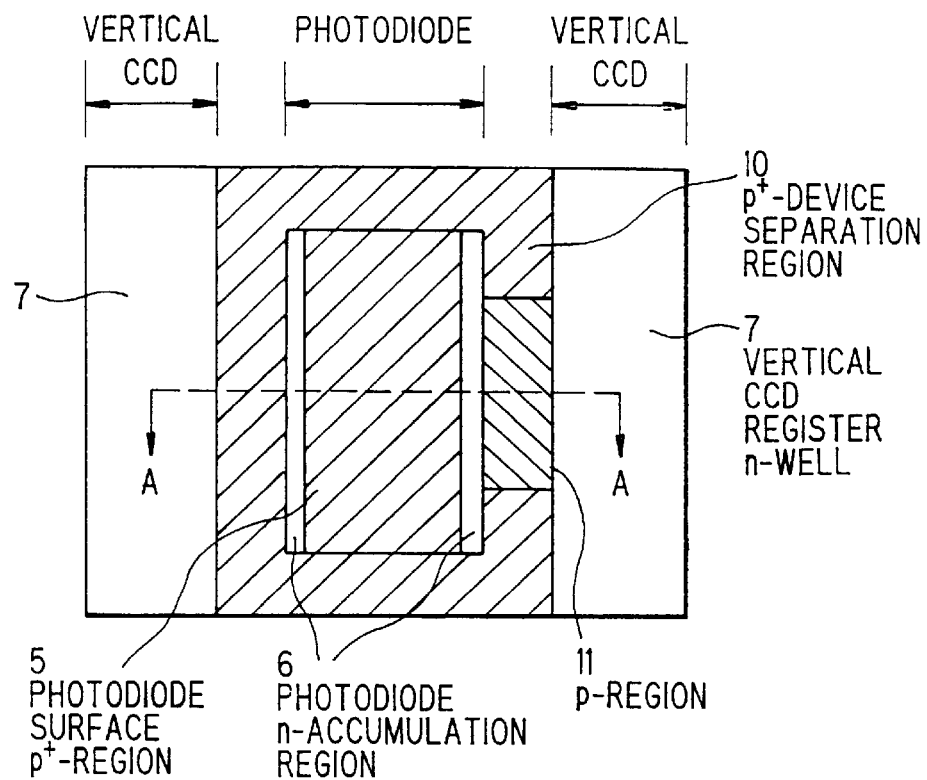
FIG. 8A is a plan view showing the pixel region of an interline transfer type CCD image sensing device in a first preferred embodiment according to the invention.
Figure 8B:
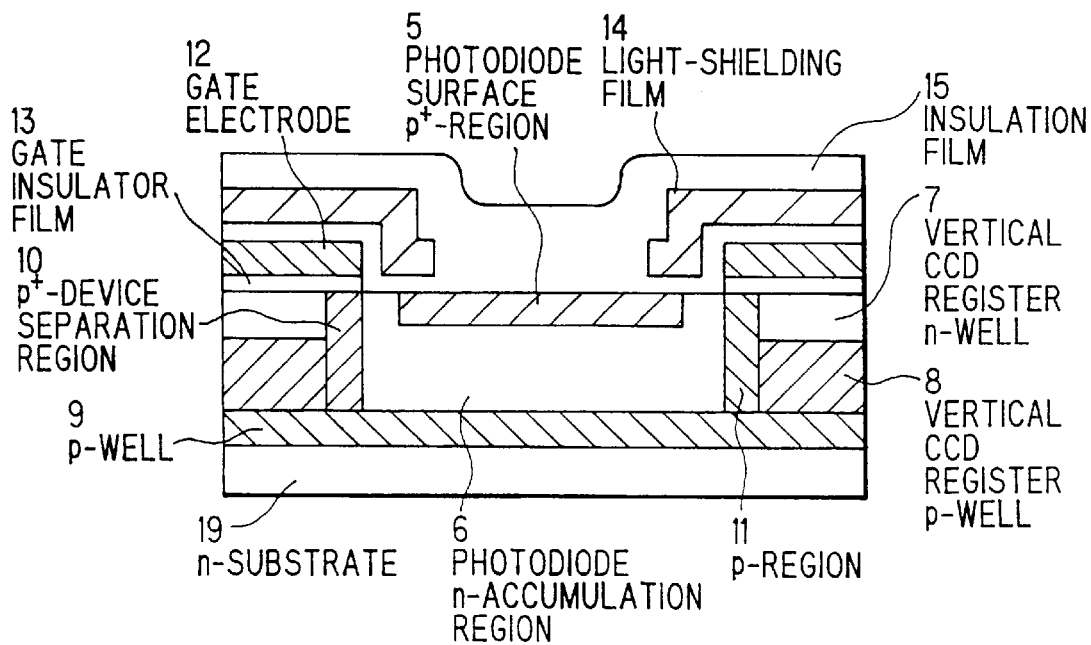
FIG. 8B is a cross sectional view cut along the line A—A in FIG. 8A, FIGS. 9A and 9B are cross sectional views showing the method of making the device in FIG. 8B.

FIG. 8A is an enlarged plan view showing the photodiode and vertical CCD register of an interline transfer type CCD image-sensing device in the first embodiment, and FIG. 8B is a cross sectional view cut along the line A—A in FIG. 8A. The n-region 6 is formed adjacent to the end of the surface p$^+$-region 5 of a photodiode to neighbor through device separation region 10 to the vertical CCD register, and the device separation region 10 is separated from the surface p$^+$-region 5 of photodiode. However, the potential of the surface p$^+$-region 5 of photodiode is grounded by that the device separation region 10 and the surface p$^+$-region 5 of photodiode are connected between photodiodes lined in the direction parallel to the transfer direction of vertical CCD register. Thus, by providing an interval between the $p^+$-region 5 and device separation region 10, the smear, false signal, can be reduced. The composition except the surface $p^+$-region 5 of photodiode and the n-accumulation region 6 is the same as that in FIG. 1B.

Figure 9A:
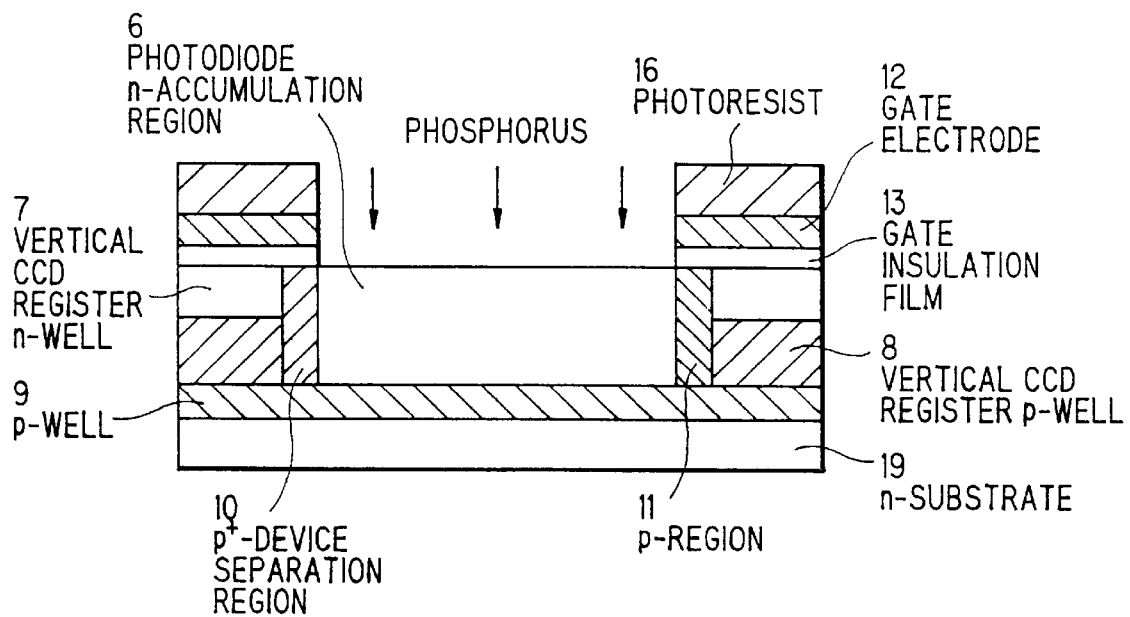
Figure 9B:
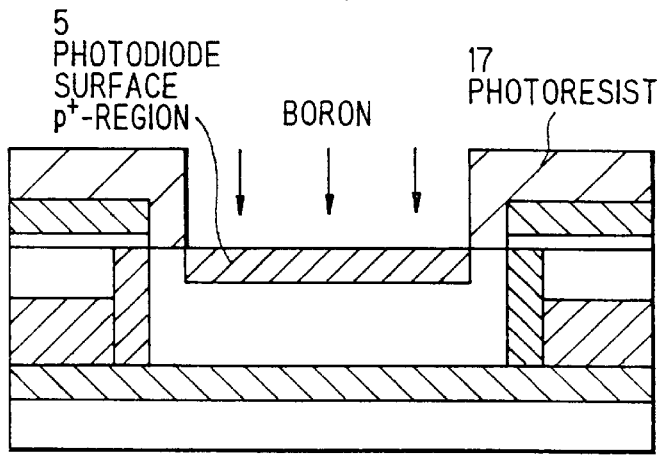

FIGS. 9A and 9B show the method of making the structure in FIG. 8B. A gate electrode 12 of the vertical CCD register is formed using photoresist 16 as a mask, then n-accumulation region 6 is, by self-alignment, formed conducting the ion-implanting of phosphorus as shown in FIG. 9A. Then, as shown in FIG. 9B, using photoresist 17 as a mask in region narrower than the interval of gate electrodes, boron is ion-implanted to form the $p^+$-region 5. Thus, the structure in FIG. 8B is obtained.

Figure 10:
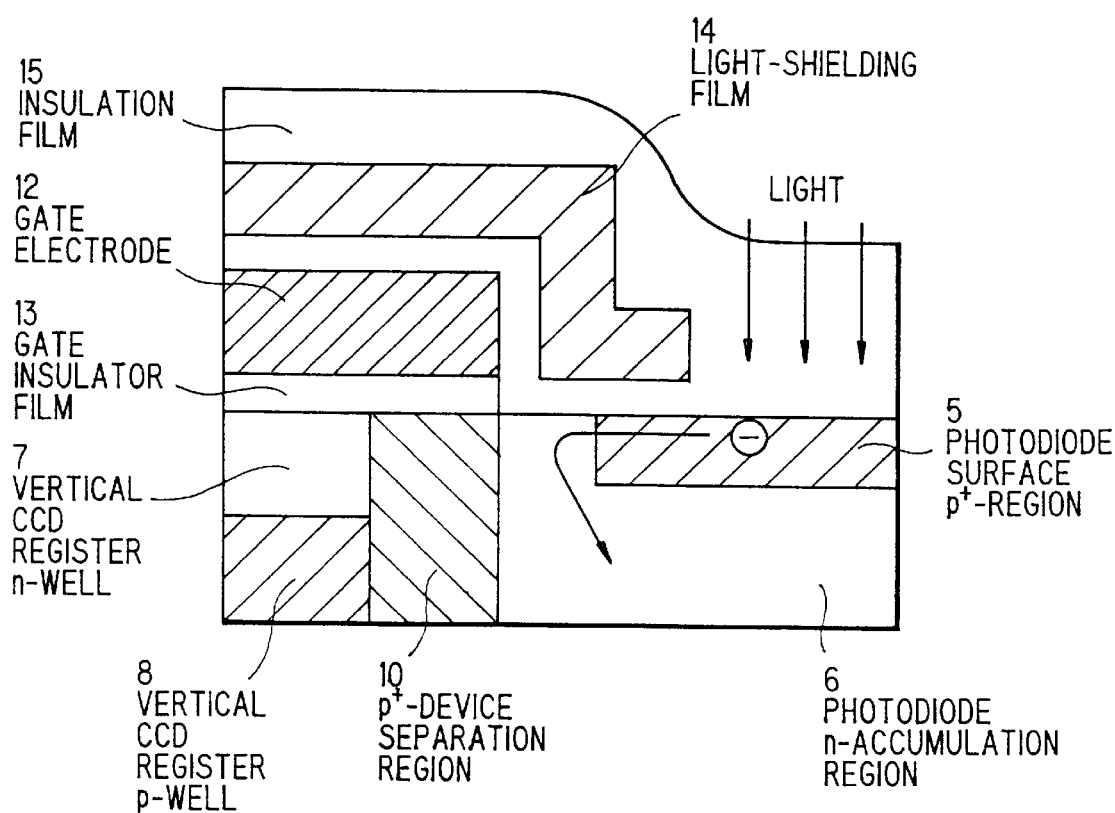
FIG. 10 is a cross sectional view illustrating the process of smear reduction in the first embodiment.

The operation of device in this invention is explained below. According to the simulation, in case of the above composition, electric charge forwarding in the horizontal direction as shown in FIG. 10 flows into the n-accumulation region 6. Thus, it can be prevented from flowing into the vertical CCD register beyond the device separation region.

Figure 11A:
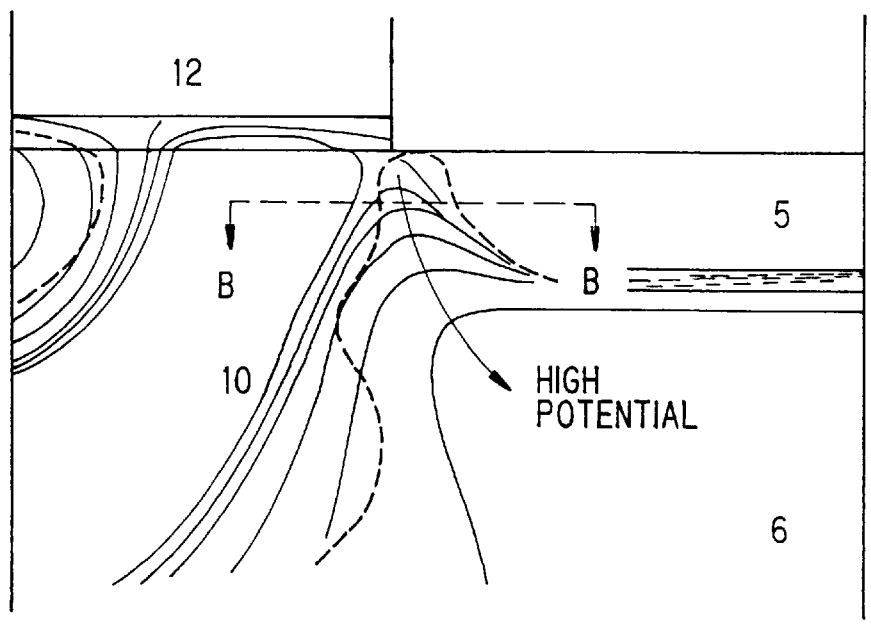
FIG. 11A is an illustration showing the potential distribution of the device in the first embodiment.
Figure 11B:
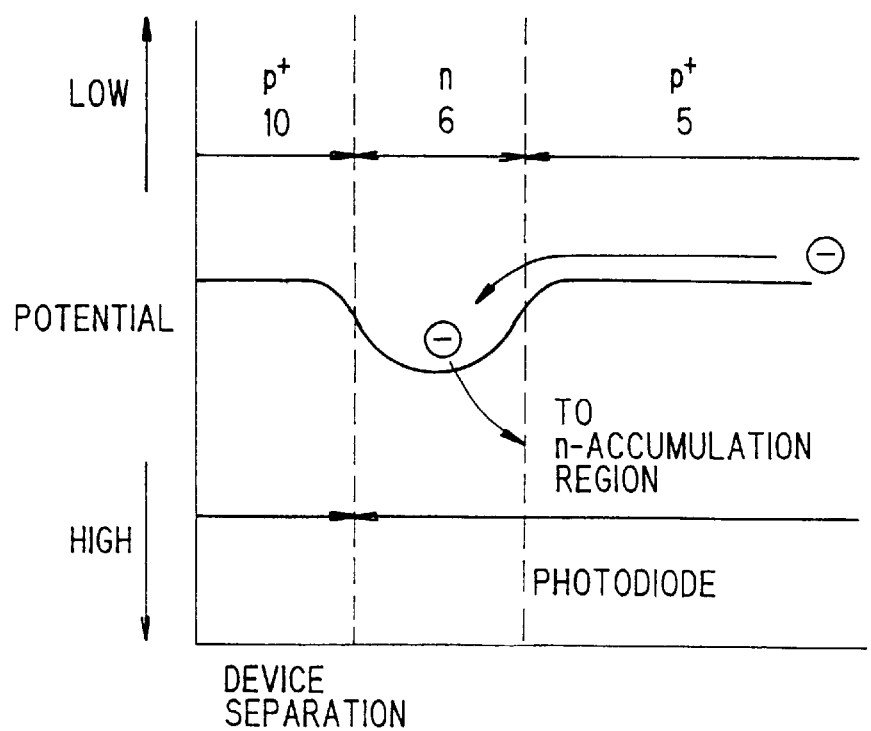
FIG. 11B is graph showing the potential distribution in cross section cut along the line B—B in FIG. 11A.

FIG. 11A shows a potential distribution in operating the device of the invention. Numerals in FIG. 11A correspond to the numerals in FIG. 10. In FIG. 11A, it will be appreciated that the potential gradient is formed in the direction from the substrate's surface side of n-region 6 between the surface $p^+$-region 5 of photodiode and the $p^+$-device separation region 10 to the inside. FIG. 11B shows a potential distribution in the cross section cut along the line B—B in FIG. 11A. Electric charge forwarding from the photodiode side through the $p^+$-region 5 to the device separation region 10 falls into a potential pocket that is formed in the n-region 6. Electric charge falling into the potential pocket flows into the photodiode accumulation region, due to the potential gradient in the n-region 6 with the potential distribution shown in FIG. 11A. Therefore, the flow of electric charge into the $p^+$-device separation region 10 can be suppressed.

Figure 12:
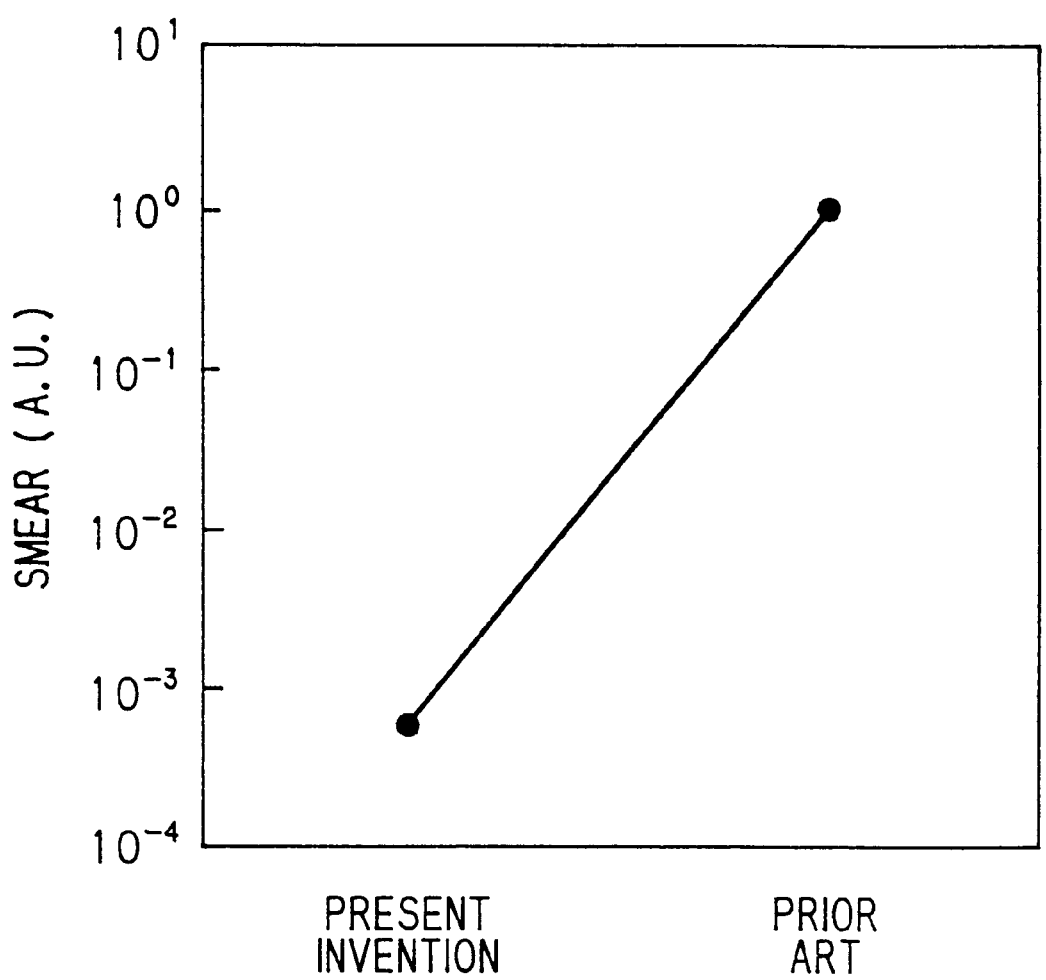
FIG. 12 is a graph showing the smear reduction effect in the first embodiment.

FIG. 12 shows the amount of smear between the embodiment of the invention and prior art. Smear is represented by the amount of false signal to flow into the vertical CCD register. This invention can offer about a three-digit reduction of smear by providing an interval of about 0.2 $\mu$m between the $p^+$-region 5 and the $p^+$-device separation region 10. Near the transfer gate, the $p^+$-region 5 is separated from the p-region 11 through the n-region 6 and smear is suppressed similarly. Meanwhile, there is a problem that dark current increases when the interval of the $p^+$-region 5 and the $p^+$-device separation region 10 is too wide. However, by setting this interval to be less than 0.5 $\mu$m, smear can be reduced certainly while suppressing the increase of dark current.

The key point of this invention is that the surface $p^+$-region 5 of photodiode is separated from the p-region 11 under the transfer gate or the device separation region 10 at least part of region neighboring to or not neighboring to the transfer gate, of the sides of photodiode where to oppose the vertical CCD register. Thus, at that part, smear can be reduced. On the other hand, there occurs crosstalk when electric charge forwarding to the charge transfer direction of vertical CCD register flows into the adjacent photodiode. However, the crosstalk can be reproduced by providing a region 6 between the $p^+$-region 5 and the device separation region 10, by the same solution to reduce the smear. Meanwhile, part of the $p^+$-region 5 is necessary to connect with the device separation region 10 so as to ground the $p^+$-region 5.

<Second Embodiment>

The second preferred embodiment of the invention is explained below.

Figure 13A:
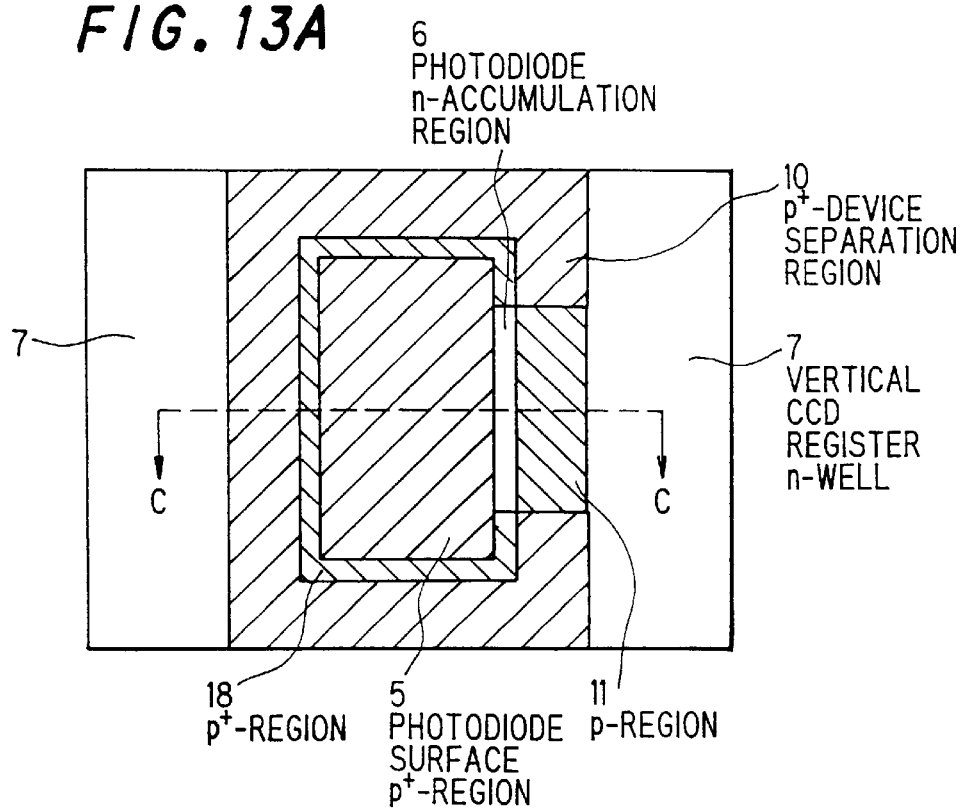
FIG. 13A is a plan view showing the pixel region of an interline transfer type CCD image sensing device in a second preferred embodiment according to the invention.
Figure 13B:
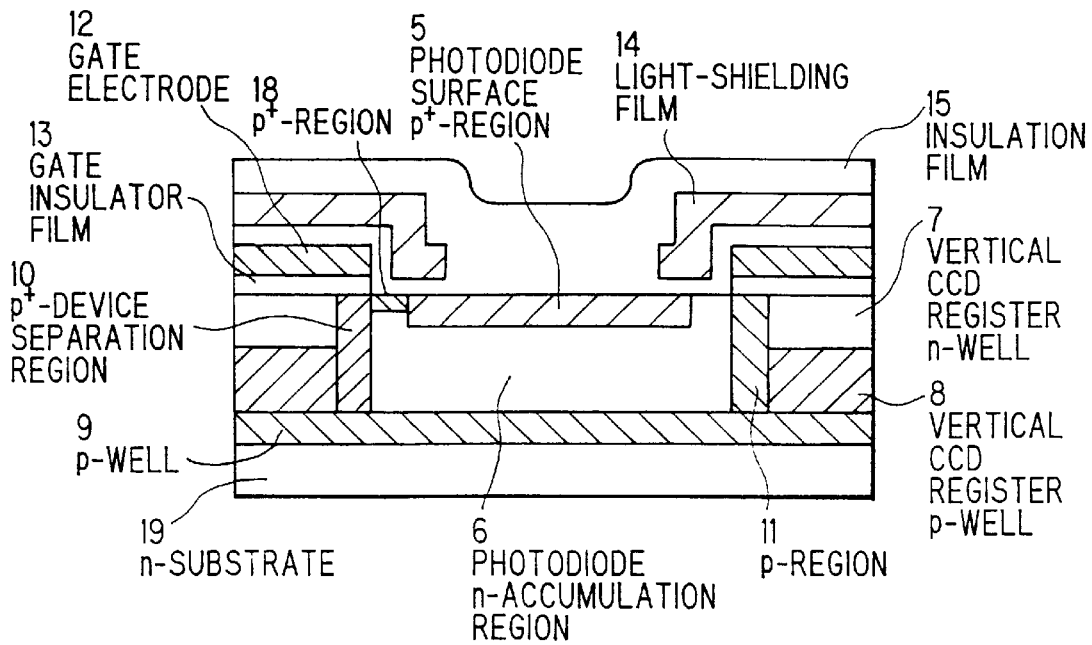
FIG. 13B is a cross sectional view cut along the line C—C in FIG. 13A, FIGS. 14A and 14B are cross sectional views showing the method of making the device in FIG. 13B.

FIG. 13A is an enlarged plan view showing the photodiode and vertical CCD register of an interline transfer type CCD image-sensing device in the second embodiment, and FIG. 13B is a cross sectional view cut along the line C—C in FIG. 13A. The surface $p^+$-region 5 of photodiode and the device separation region 10 are connected together through $p^+$-region 18 whose junction depth with the n-accumulation region 6 is shallower than that of the center of photodiode. The composition except the surface $p^+$-region 5, 18 of photodiode and the n-accumulation region 6 is the same as that in FIG. 1B. By using this composition, the possibility that signal charge comes into a smear component due to the diffusion can be reduced.

Figure 14A:
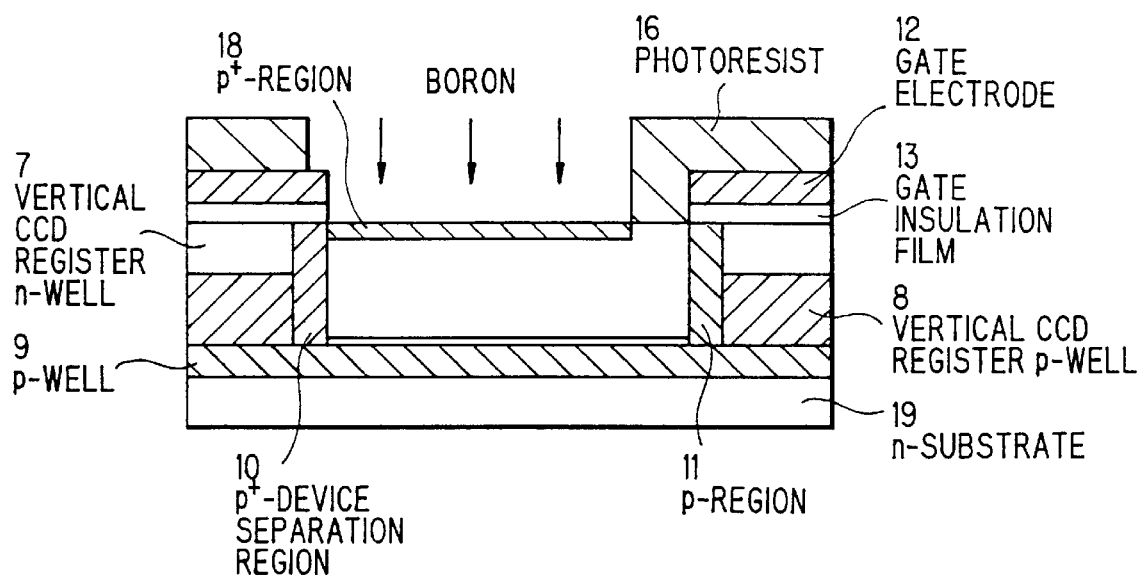
Figure 14B:
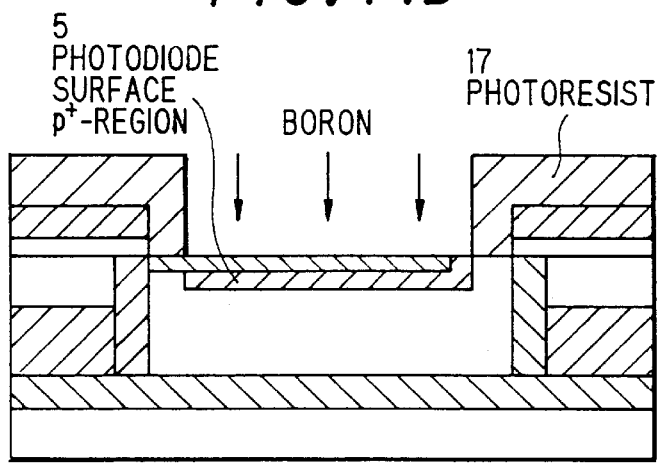

The method of making the device in the second embodiment is explained in FIGS. 14A and 14B. At first, as shown in FIG. 14A, the $p^+$-region 18 with shallow junction surface to connect the device separation region 10 is formed by conducting the ion-implantation of boron using photoresist 16 as a mask. When in the ion-implantation, $BF_2$, GA, In etc. with a molecular weight more than boron are used, the spread in the depth direction reduces and therefore the $p^+$-region 18 with shallower junction surface is formed. Then, as shown in FIG. 14B, boron is ion-implanted, using photoresist 17 as a mask, so that the $p^+$-region 5 is separated from the p-region 11 of transfer gate and the device separation region 10 and is formed deeper than the $p^+$-region 18. Hereupon, when the ion-implantation is conducted so that the $p^+$-regions 5 overlaps with the $p^+$-region 18 as shown in FIG. 14B, the margin against a deviation in mask pattern increases.

Figure 15:
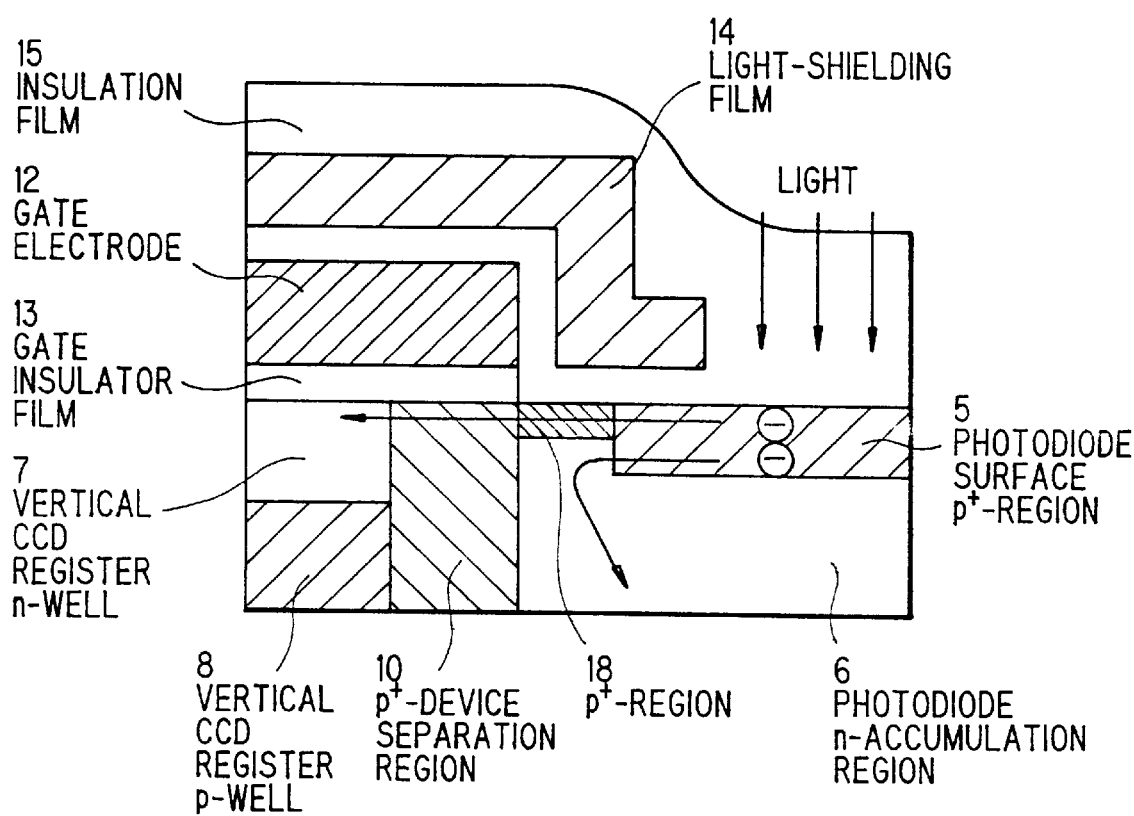
FIG. 15 is a cross sectional view illustrating the process of smear reduction in the second embodiment.

In FIG. 15, a reduction in smear is explained. In this structure, since the $p^+$-region 18 with shallow junction surface is connected to the $p^+$-device separation region 10, signal charge near the surface of the $p^+$-region 5 comes into a smear. However, since signal charge occurring at relatively deep region of the $p^+$-region 5 flows into the n-accumulation region 6 as shown in FIG. 15, signal charge capable of coming into smear can be reduced as compared with that in the conventional structure.

Figure 16:
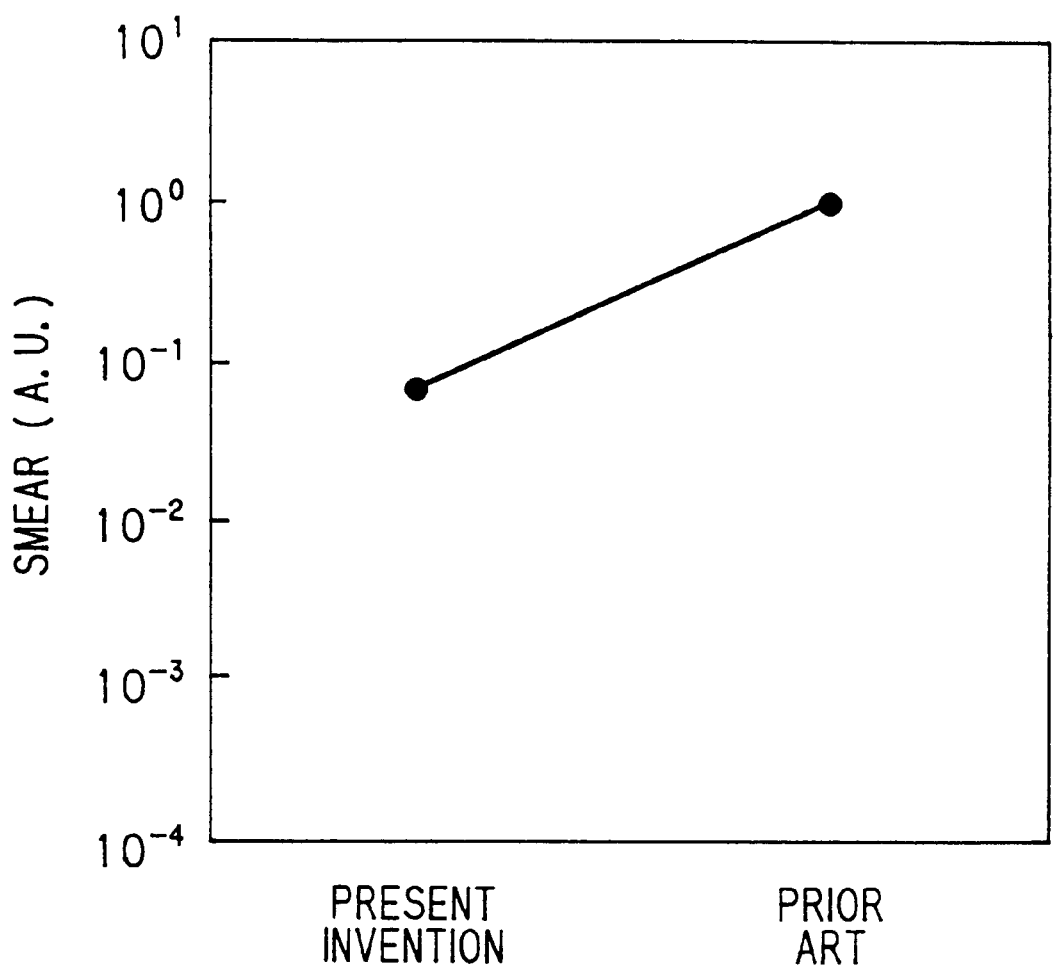
FIG. 16 is a graph showing the smear reduction effect in the second embodiment.

FIG. 16 shows the simulation result of the device in this embodiment. According to the result, when the depth of junction surface of the $p^+$-region 5 to the n-accumulation region 6 is about 0.4 $\mu$m, by setting the depth of junction surface of the $p^+$-region 18 to the n-accumulation region 6 to be about 0.2 $\mu$m, about an one-digit reduction of smear can be offered. With the existence of $p^+$-region 18, the smear reduction effect can be obtained regardless of the concentration of impurity. However, by providing the $p^+$-region 18 with an impurity concentration higher than that of the $p^+$-region 5, the potential barrier is formed by built-in voltage by the difference of impurity concentration between the $p^+$-regions 5 and 18, the possibility that signal charge comes into a smear component due to the diffusion can be reduced. Also, when the $p^+$-region 18 is provided with an impurity concentration lower than that of the device separation region 10, there occurs a potential pocket at the shallow $p^+$-region 18. Therefore, the potential barrier generated between the device separation region 10 and the shallow $p^+$-region 18 can reduce the smear effectively.

Figure 17:
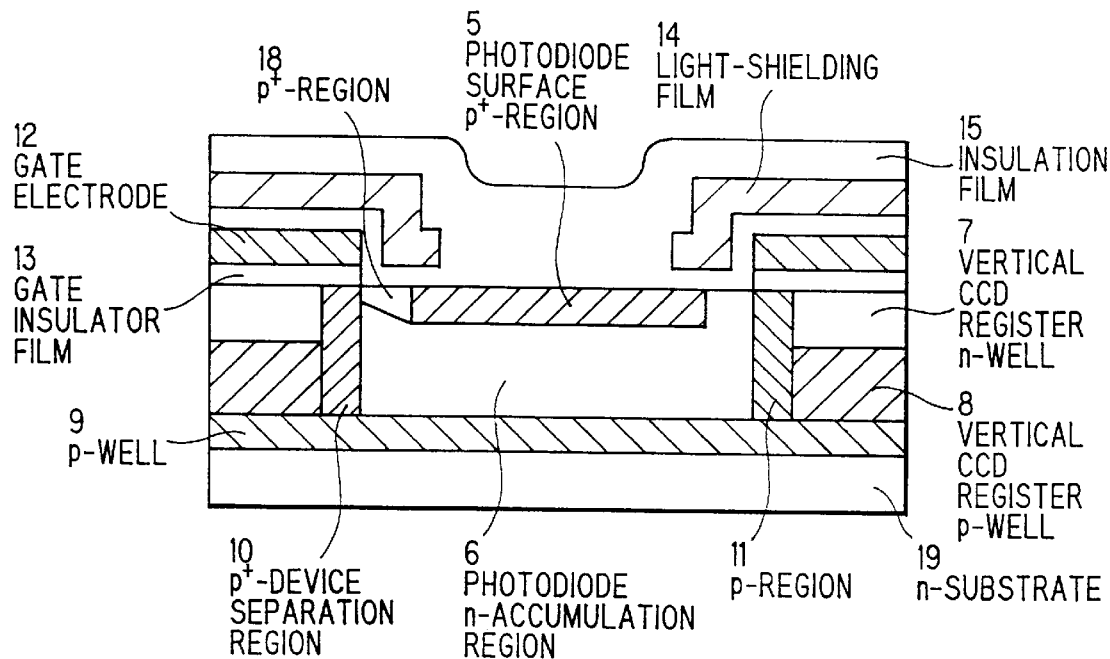
FIG. 17 is a cross sectional view showing a first modification in the second embodiment.
Figure 18:
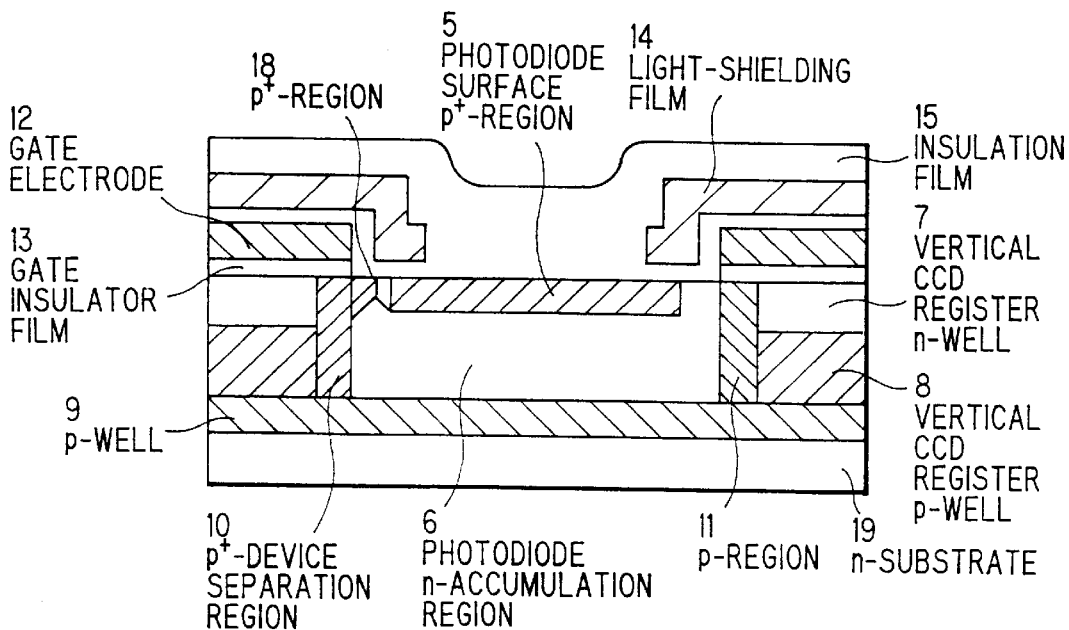
FIG. 18 is a cross sectional view showing a second modification in the second embodiment.

The $p^+$-region 18 may have such a shape that the depth of junction surface decreases gradually from the $p^+$-region 5 to the $p^+$-device separation region 10 as shown in FIG. 17, or such a shape that the depth of junction surface decreases partially between the $p^+$-region 5 to the $p^+$-device separation region 10 as shown in FIG. 18.

Figure 19:
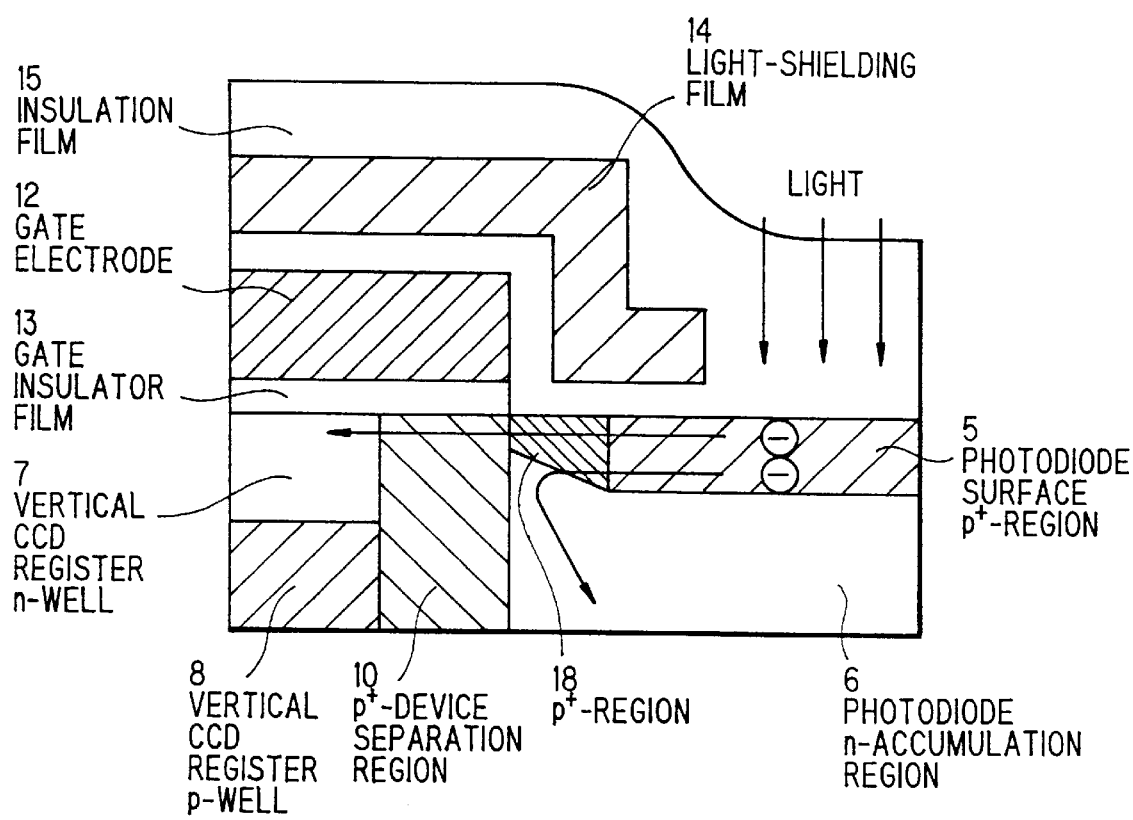
FIG. 19 is a cross sectional view illustrating the process of smear reduction in the first modification of the second embodiment.

In FIG. 19, a reduction in smear is explained. In this structure, signal charge occurred at relatively deep position of the p⁺-region 5 and forwarding to the vertical CCD register flows into the n-accumulation region 6 at shallow part of the p⁺-region 18 as shown in FIG. 19. Thus, the electric charge that may cause a smear can be reduced. Also in the structure in FIG. 18, the electric charge that may cause a smear can be reduced similarly.

Figure 20A:
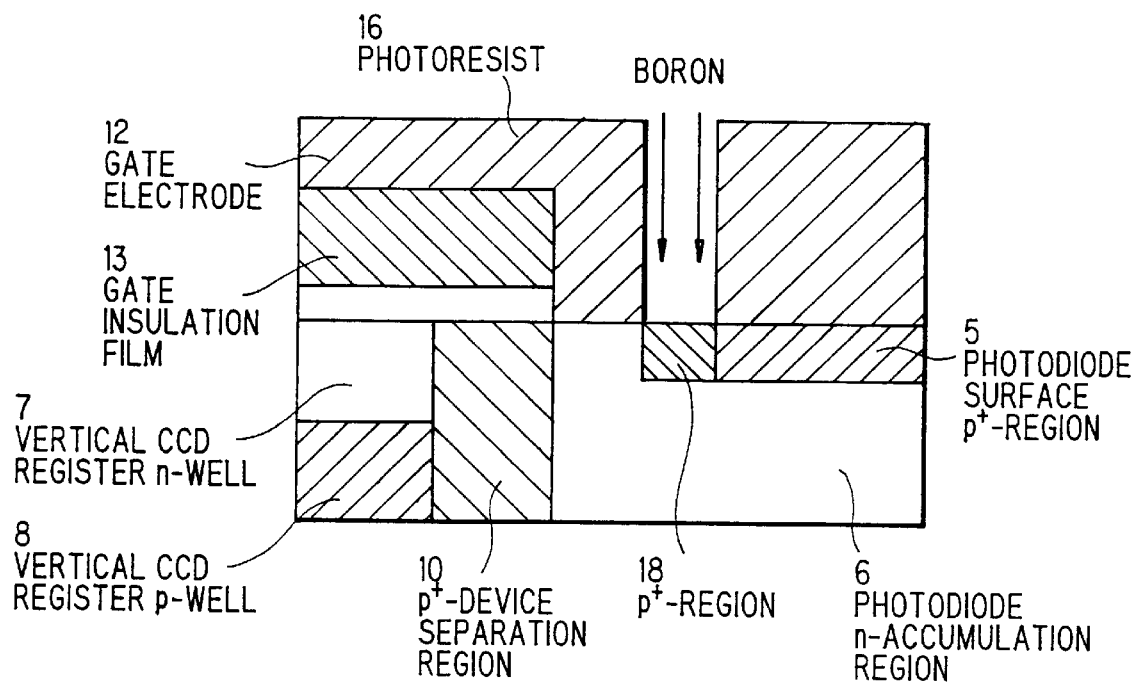
FIGS. 20A and 20B are cross sectional views showing a first method of making the structure in the first modification of the second embodiment.
Figure 20B:
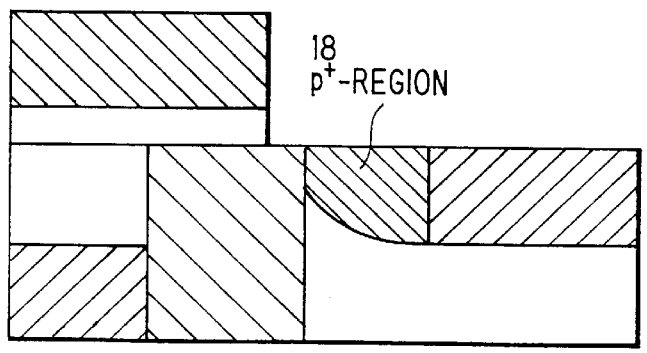

Examples of the method of making the structure in FIG. 17 are shown in FIGS. 20A to 21B, which are all enlarged views near the device separation region 10. At first, as shown in FIG. 20A, p⁺-region 18 separated from the device separation region 10 is formed at the end of p⁺-region 5 by ion-implantation of boron using photoresist 16 as a mask. The p⁺-regions 5 and 18 may be formed simultaneously by using a resist mask that opens for the regions 5 and 18. Then, diffusing the impurity by thermal treatment, the p⁺-region 18 that shallows gradually in the direction of the device separation region 10 as shown in FIG. 20B can be formed.

Figure 21A:
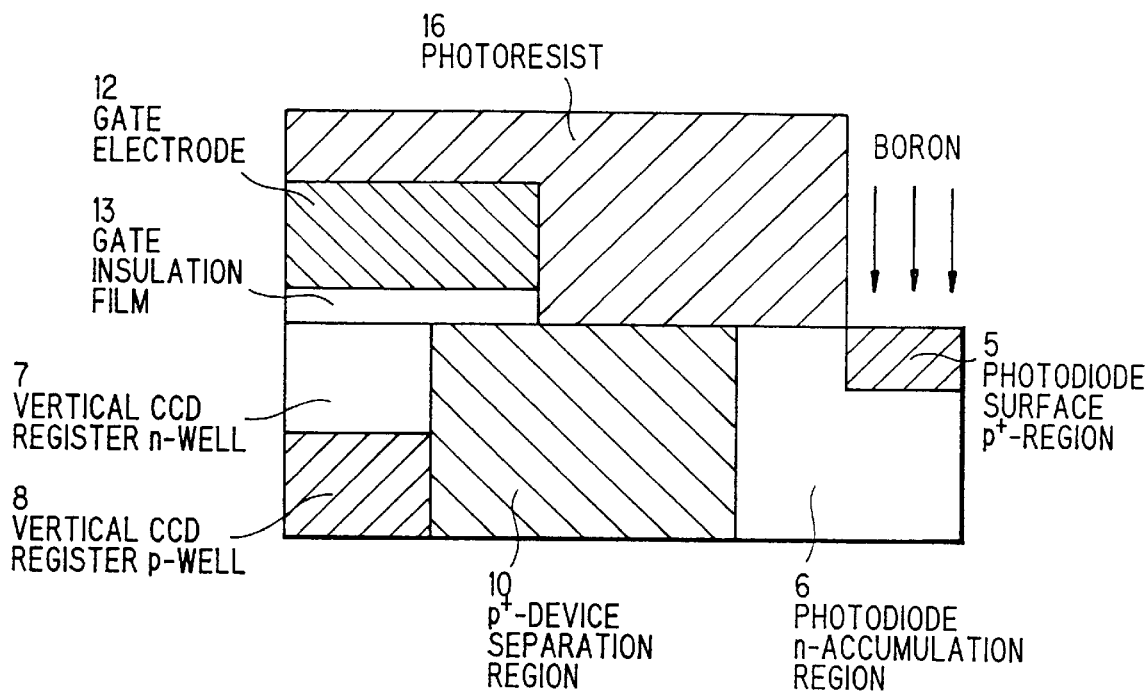
FIGS. 21A and 21B are cross sectional views showing a second method of making the structure in the first modification in the second embodiment.
Figure 21B:
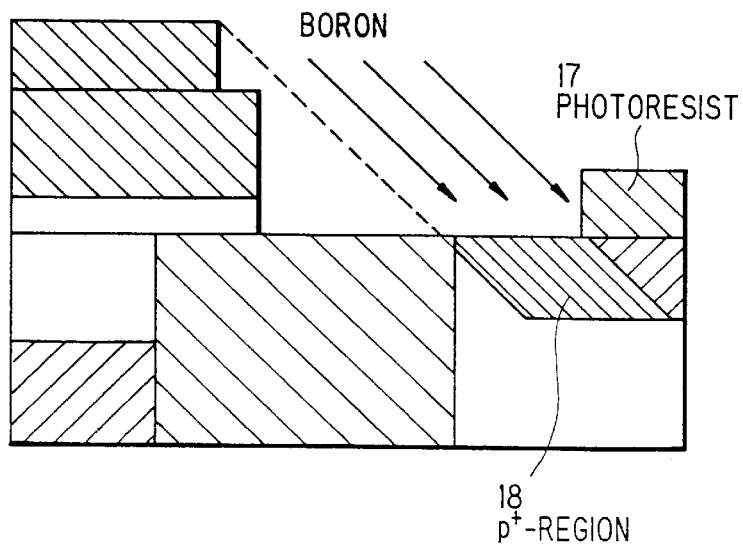

In another example in FIGS. 21A and 21B, at first, the p⁺-region 5 is formed separated from the device separation region 10 using photoresist 16 as a mask as shown in FIG. 21A. Then, by conducting the ion-implantation in the direction inclined from the normal line of the substrate surface using photoresist 17 as a mask as shown in FIG. 21B, the p⁺-region 18 with shallow part on the device separation region 10 can be formed. The p⁺-regions 5 and 18 may be formed simultaneously by using a resist mask that opens for the regions 5 and 18.

Figure 22A:
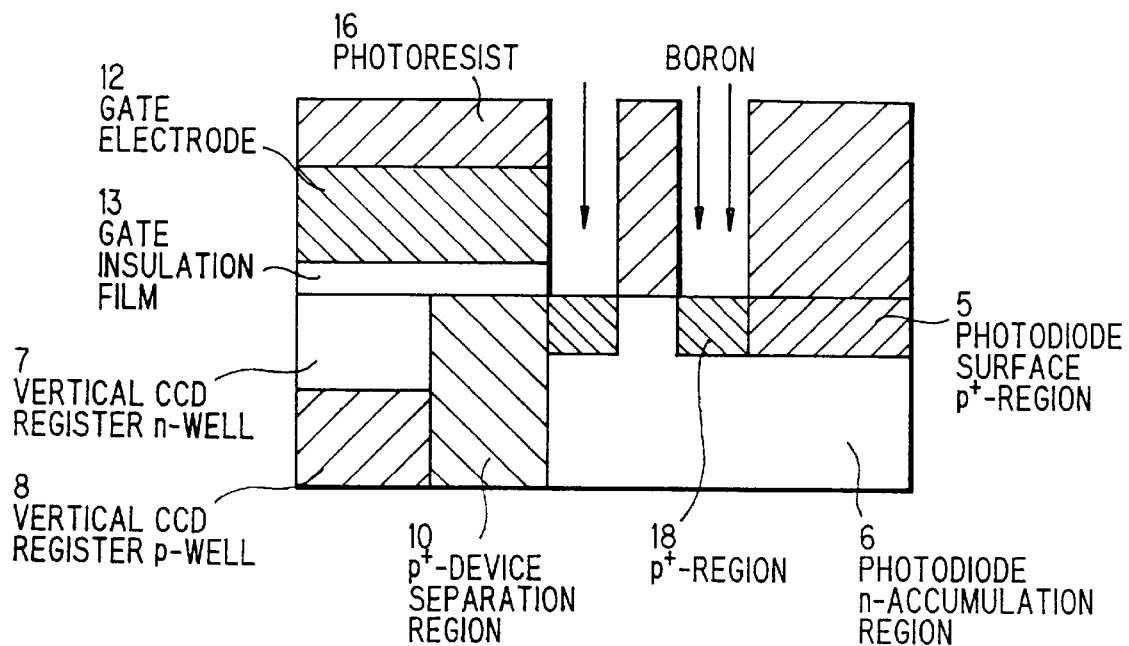
FIGS. 22A and 22B are cross sectional views showing a first method of making the structure in the second modification of the second embodiment.
Figure 22B:
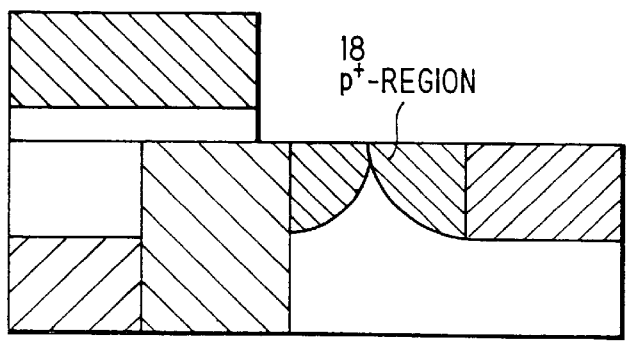

Examples of the method of making the structure in FIG. 18 are shown in FIGS. 22A to 23B, which are all enlarged views near the device separation region 10. At first, as shown in FIG. 22A, two p⁺-regions 18 separated by the photoresist 16 are formed at the ends of p⁺-region 5 and device separation region 10 by ion-implantation of boron. The p⁺-regions 5 and 18 may be formed simultaneously by using a resist mask that opens for the regions 5 and 18. Then, diffusing the impurity by thermal treatment, the p⁺-region 18 that shallows partially as shown in FIG. 22B can be formed.

Figure 23A:
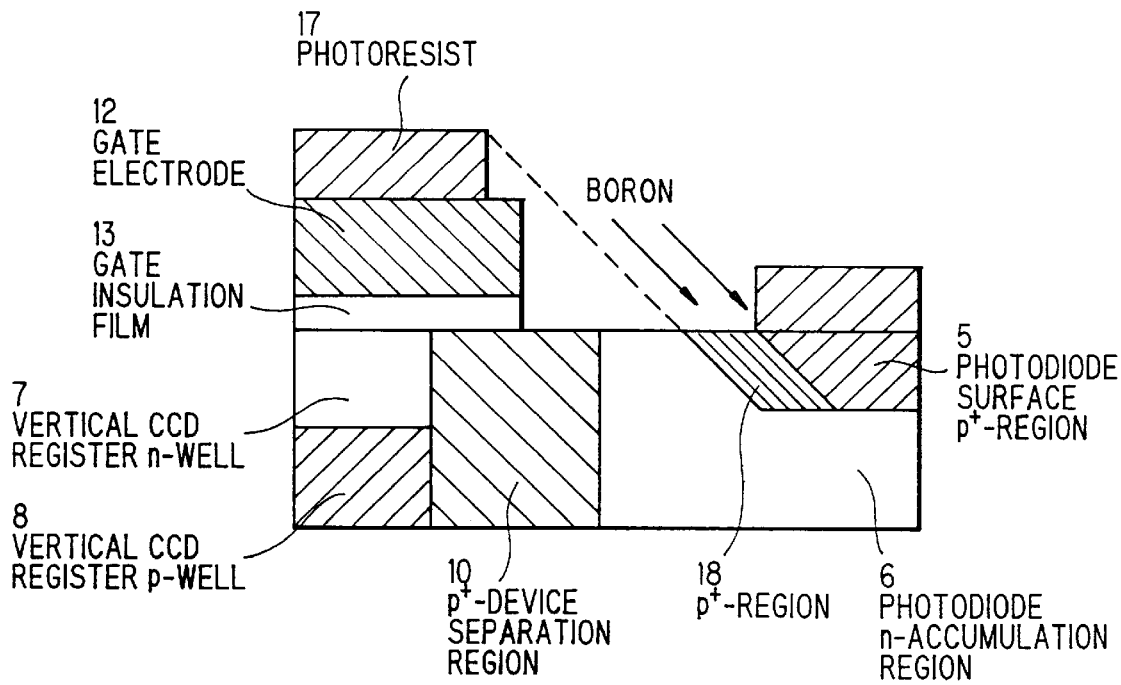
FIGS. 23A and 23B are cross sectional views showing a second method of making the structure in the second modification in the second embodiment.
Figure 23B:
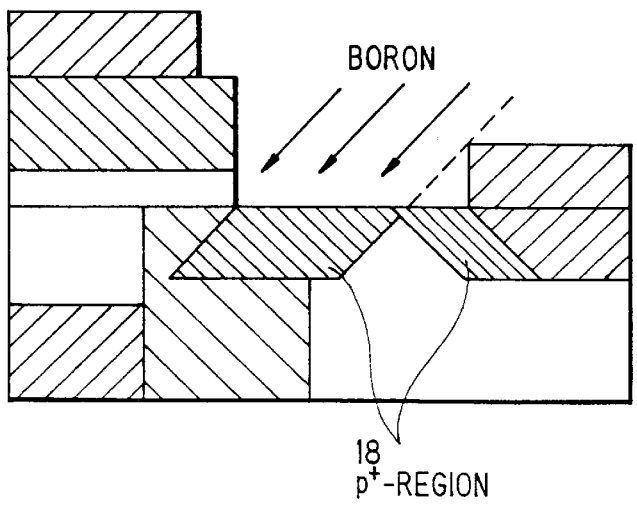

In another example in FIGS. 23A and 23B, at first, the p⁺-region 5 is formed separated from the device separation region 10. Then, as shown in FIG. 23A, the ion-implantation is conducted in the direction inclined from the normal line of the substrate surface using photoresist 17 as a mask. Then, as shown in FIG. 23B, the ion-implantation is conducted in the direction inclined from the normal line of the substrate surface reversely to the direction in FIG. 23A. Thus, the p⁺-region 18 with partially shallow part can be formed.

<Third Embodiment>

The third preferred embodiment of the invention is explained below.

Figure 24A:
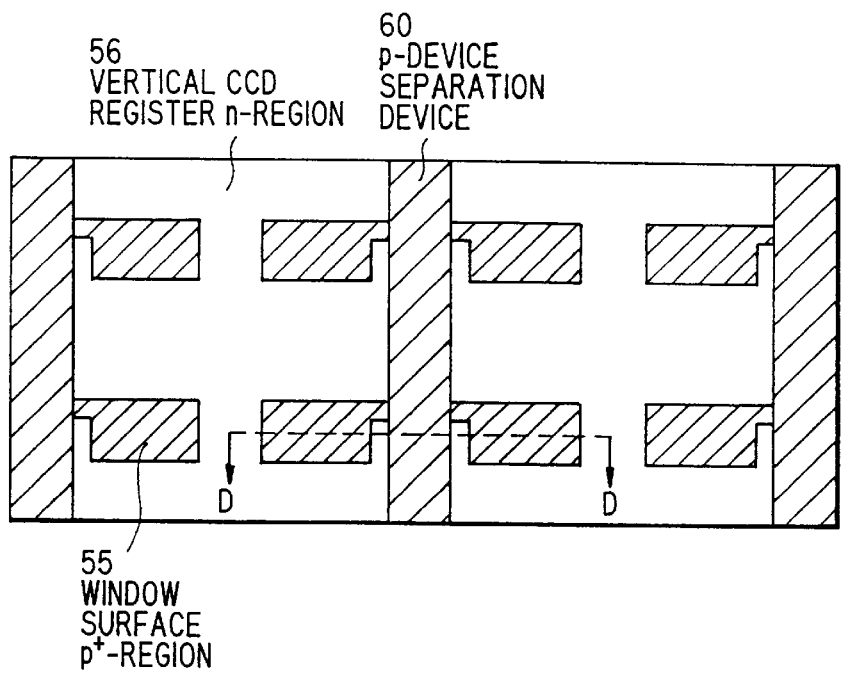
FIG. 24A is a plan view showing the pixel region of a frame transfer type CCD image sensing device in a third preferred embodiment according to the invention.
Figure 24B:
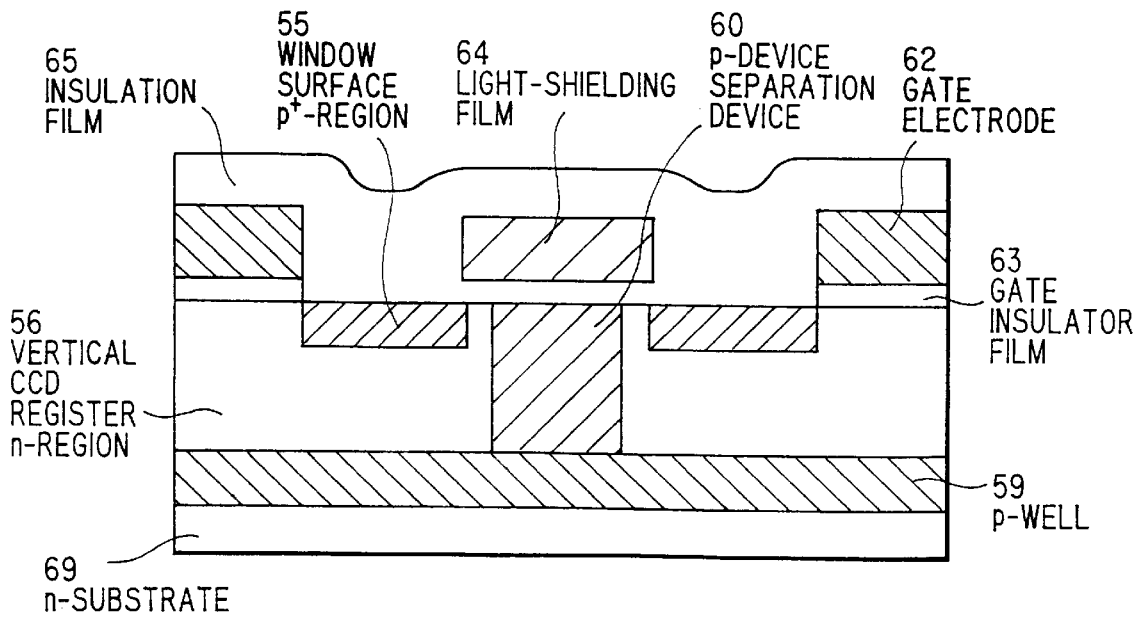
FIG. 24B is a cross sectional view cut along the line D—D in FIG. 24A.

FIG. 24A is a schematic plan view showing the pixel region of a frame transfer type CCD image sensing device in the third embodiment for suppressing the crosstalk between windows. It is characterized by that n-region 56 is formed between window surface p⁺-region 55 and p⁺-device separation region 60. Meanwhile, part of the p⁺-region 55 is connected to the p⁺-device separation region 60 so that the window surface p⁺-region 55 is grounded. FIG. 24B is a cross sectional view cut along the line D—D in FIG. 24A. The composition except the window surface p⁺-region 55 and n-region 56 is the same as that in FIGS. 4A and 4B.

Figure 25:
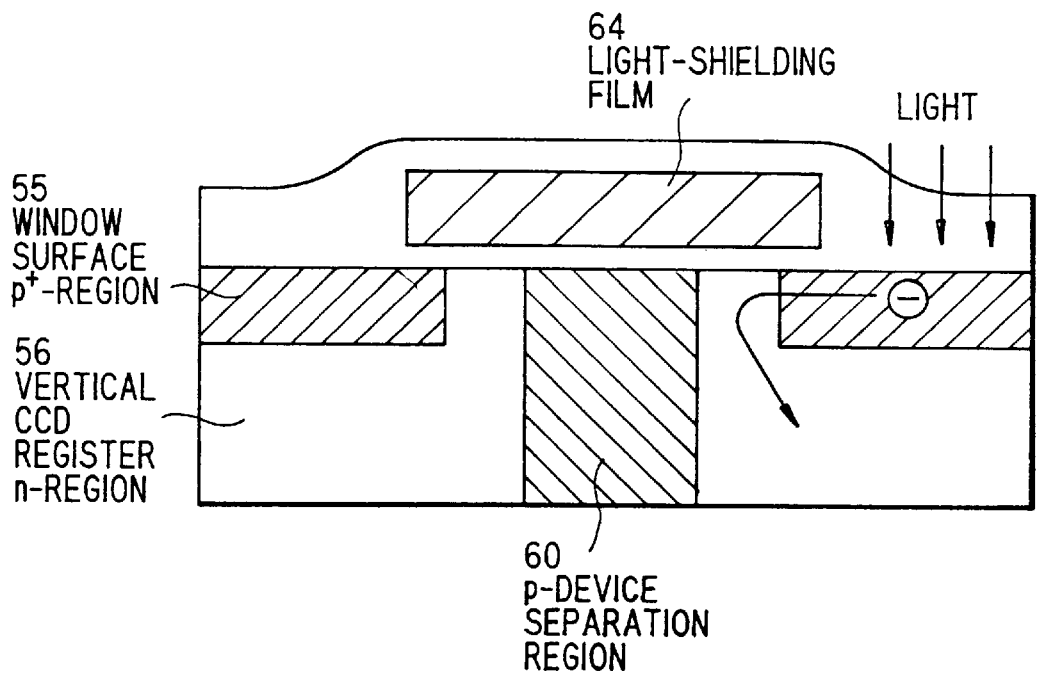
FIG. 25 is a cross sectional view illustrating the process of smear reduction in the third embodiment.

FIG. 25 is an enlarged cross sectional view showing the vicinity of the device separation region 60. Like the first embodiment, of signal charge occurred in the window surface p⁺-region 55, charge forwarding to the adjacent pixel does not reach the p⁺-device separation region 60 but flows into the n-accumulation region 56 in its own pixel. Thus, signal charge does not flow into the adjacent pixel at part where the above structure is employed. Therefore the crosstalk can be reduced.

Figure 26:
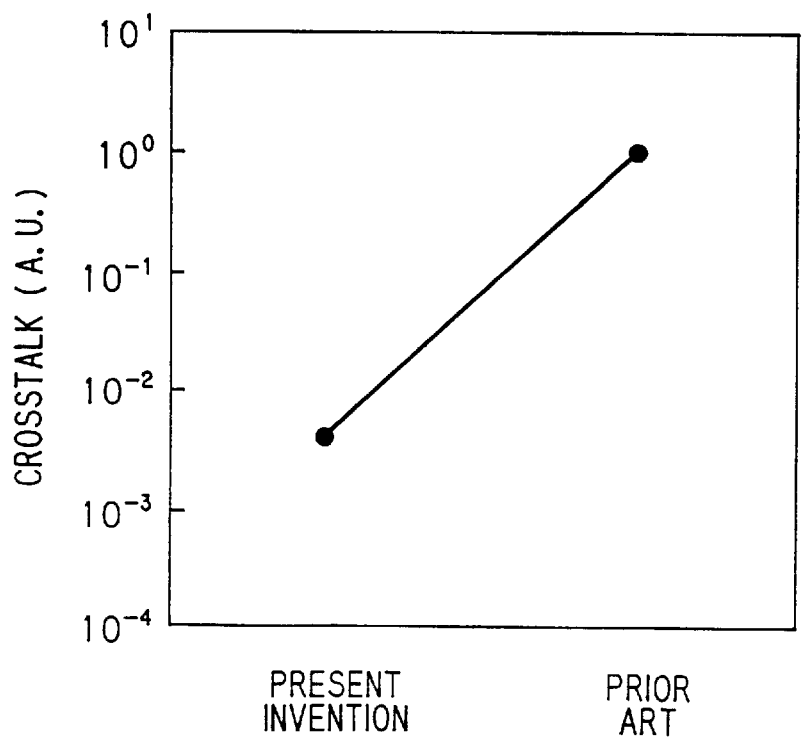
FIG. 26 is a graph showing the smear reduction effect in the third embodiment.

FIG. 26 shows the simulation result. Smear is represented by the amount of false signal to flow into the adjacent pixel. As shown, it will be appreciated that about a two-digit reduction of the amount of false signal is seen at part where the invention is applied.

<Fourth Embodiment>

The fourth preferred embodiment of the invention is explained below.

FIG. 27A is a schematic plan view showing the pixel region of a frame transfer type CCD image sensing device in the fourth embodiment. FIG. 27B is a cross sectional view cut along the line E—E in FIG. 27A. It is characterized by that the window surface p⁺-region 55 and the p⁺-device separation region 60 are connected through p⁺-region 68 whose junction surface to the n-region 56 is shallower than that of the center of the window. The composition except the window surface p⁺-regions 55, 68 and n-region 56 is the same as that in FIGS. 4A and 4B.

Figure 28:
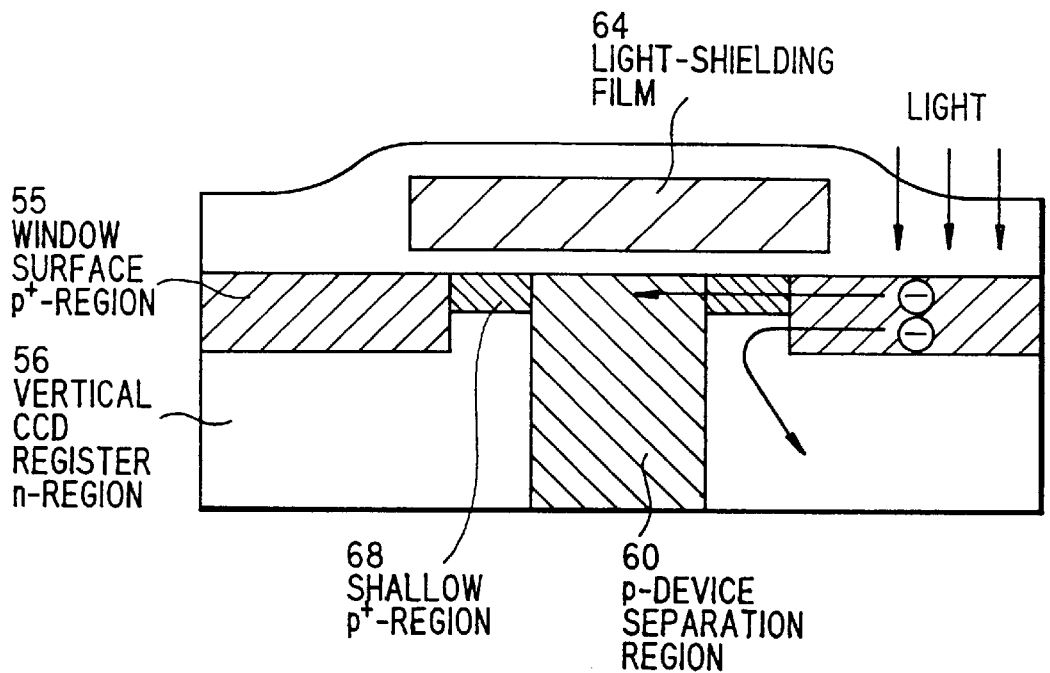
FIG. 28 is a cross sectional view illustrating the process of smear reduction in the fourth embodiment.

FIG. 28 is an enlarged cross sectional view showing the vicinity of the device separation region 60. Like the second embodiment, false signal charge passing through near the substrate surface of the window surface p⁺-region 55 is unaltered, but electric charge generated at deep part of the p⁺-region 55 flows into the n-region 56 as shown in FIG. 28.

Figure 29:
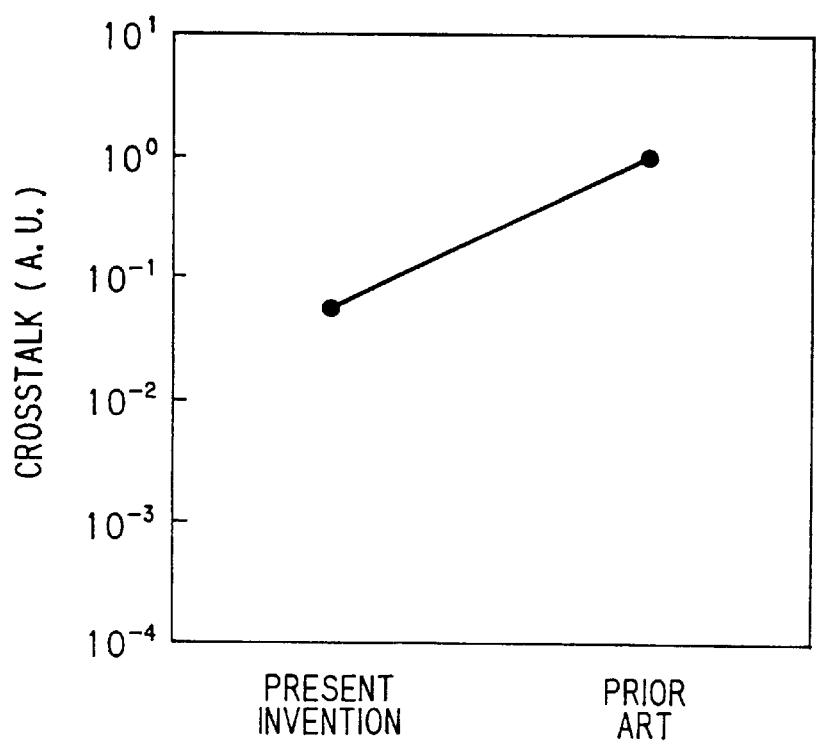
FIG. 29 is a graph showing the smear reduction effect in the fourth embodiment.

FIG. 29 shows the simulation result. The invention can offer about an one-digit reduction of crosstalk.

Figure 30A:
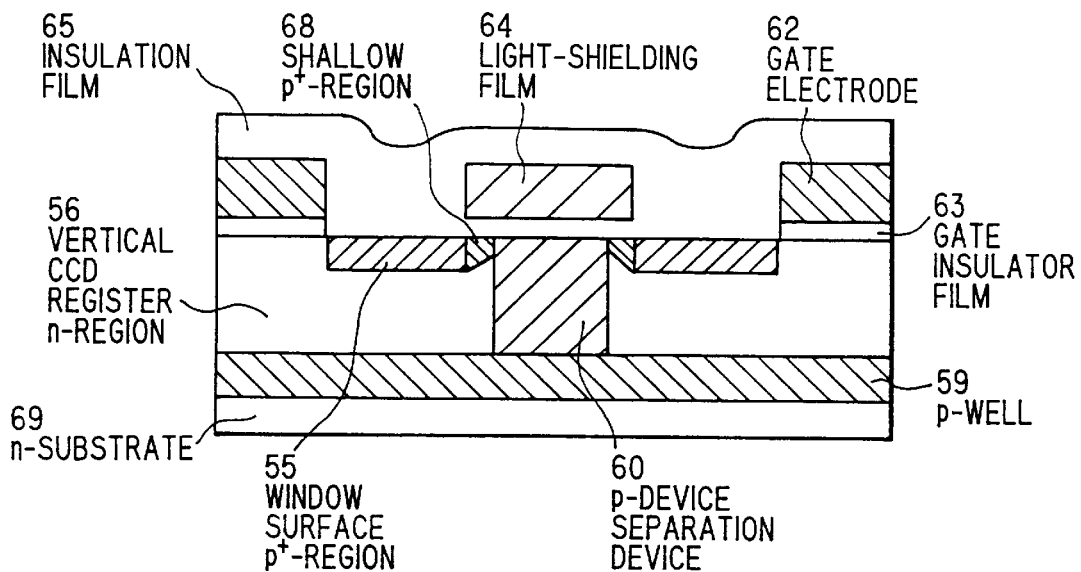
FIGS. 30A and 30B are cross sectional views showing a first modification and a second modification, respectively, in the fourth embodiment.
Figure 30B:
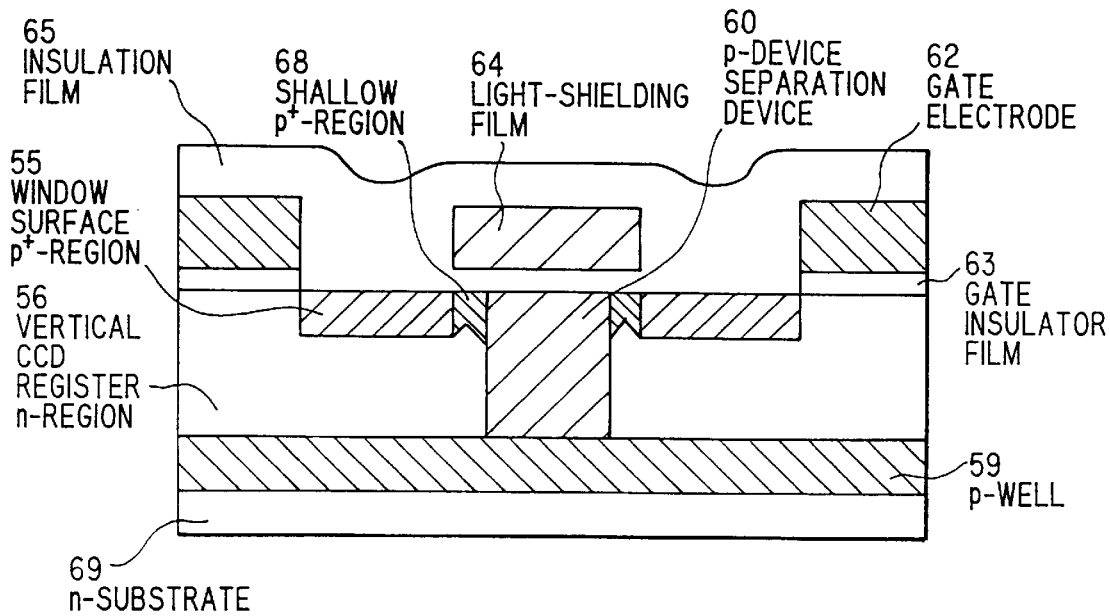

Meanwhile, the p⁺-region 68 may have such shapes as shown in FIGS. 30A and 30B. In any case, such a smear reduction effect as illustrated in FIG. 19 can be obtained by that signal charge occurred relatively deep part of the p⁺-region 55 flows into n-region 56 at shallow part of the p⁺-region 68. Also, any structure can be made by using one of the methods shown in FIGS. 20A to 23B.

The structures in the first to fourth embodiments are shown for the example that signal charge is of electron. However, when the signal charge is of hole, the same effects can be obtained by replacing p-type by n-type and n-type by p-type as to semiconductor type in the above explanations. Also, the first and second embodiments of the invention can be applied not only to an interline transfer type CCD but also to a solid-state image sensing device that is provided with photodiode and transfer section or signal line. Also, the above embodiments may be combined. For example, connection part with the second-conductivity-type device separation region in the first embodiment may be composed of shallow second-conductivity-type region shown in the second embodiment.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A photoelectric transducer, comprising:
   a photodiode that is formed on a second-conductivity-type well and is composed of a first-conductivity-type region to accumulate signal charge when light is supplied and a second-conductivity-type region formed on said first-conductivity-type region;
   wherein said second-conductivity-type region except part where the potential of said second-conductivity-type region is grounded is separated from a secondconductivity-type device separation region by said first-conductivity-type region.

2. A solid-state image sensing device, comprising:
a photoelectric transducer comprising a photodiode that is formed on a second-conductivity-type well and is composed of a first-conductivity-type region to accumulate signal charge when light is supplied and a second-conductivity-type region formed on said first-conductivity-type region, wherein said second-conductivity-type region except part where the potential of said second-conductivity-type region is grounded is separated from a second-conductivity-type device separation region by said first-conductivity-type region; and
a signal-charge transfer section or signal line that is connected through a transfer gate to said photodiode;
wherein said second-conductivity-type device separation region is provided in a region except said transfer gate between said photodiode and said signal-charge transfer section or signal line.

3. A solid-state image sensing device, according to claim 2, wherein:
said second-conductivity-type device separation region parallel to said signal-charge transfer section is separated from said second-conductivity-type region by said first-conductivity-type region.

4. A solid-state image sensing device, comprising:
a plurality of light-receiving units that are arrayed on a second-conductivity-type well and are composed of a first-conductivity-type region to accumulate signal charge when light is supplied and a second-conductivity-type region formed on said first-conductivity-type region, wherein said second-conductivity-type region except part where the potential of said second-conductivity-type region is grounded is separated from a second-conductivity-type device separation region that is formed between said light-receiving units by said first-conductivity-type region.

5. A solid-state image sensing device, according to claim 2, wherein:
said second-conductivity-type region is separated from said second-conductivity-type device separation region by said first-conductivity-type region with a width of less than 0.5 µm.

6. A solid-state image sensing device, according to claim 4, wherein:
said second-conductivity-type region is separated from said second-conductivity-type device separation region by said first-conductivity-type region with a width of less than 0.5 µm.

7. A solid-state image sensing device, according to claim 2, wherein:
said part where the potential of said second-conductivity-type region is grounded is of a second second-conductivity-type region that is formed to be shallower than said second-conductivity-type region.

8. A solid-state image sensing device, according to claim 4, wherein:
said part where the potential of said second-conductivity-type region is grounded is of a second second-conductivity-type region that is formed to be shallower than said second-conductivity-type region.

9. A photoelectric transducer, comprising:
a photodiode that is formed on a second-conductivity-type well and is composed of a first-conductivity-type region to accumulate signal charge when light is supplied and a first second-conductivity-type region formed on said first-conductivity-type region;
wherein said first second-conductivity-type region is separated from a second-conductivity-type device separation region and is connected to said second-conductivity-type device separation region at part of the circumference of said first second-conductivity-type region through a second second-conductivity-type region that is formed to be at least partially shallower than said first second-conductivity-type region.

10. A solid-state image sensing device, comprising:
a photodiode that is formed on a second-conductivity-type well and is composed of a first-conductivity-type region to accumulate signal charge when light is supplied and a first second-conductivity-type region formed on said first-conductivity-type region; wherein said first second-conductivity-type region is separated from a second-conductivity-type device separation region and is connected to said second-conductivity-type device separation region at part of the circumference of said first second-conductivity-type region through a second second-conductivity-type region that is formed to be at least partially shallower than said first second-conductivity-type region; and
a signal-charge transfer section or signal line that is connected through a transfer gate to said photodiode;
wherein said second-conductivity-type device separation region is provided in a region except said transfer gate between said photodiode and said signal-charge transfer section or signal line.

11. A solid-state image sensing device, comprising:
a plurality of light-receiving units that are arrayed on a second-conductivity-type well and are composed of a first-conductivity-type region to accumulate signal charge when light is supplied and a first second-conductivity-type region formed on said first-conductivity-type region,
wherein said first second-conductivity-type region is separated from a second-conductivity-type device separation region and is connected to said second-conductivity-type device separation region at part of the circumference of said first second-conductivity-type region through a second second-conductivity-type region that is formed to be at least partially shallower than said first second-conductivity-type region.

12. A solid-state image sensing device, according to claim 10, wherein:
said second-conductivity-type region has an impurity concentration higher than said first second-conductivity-type region.

13. A solid-state image sensing device, according to claim 11, wherein:
said second second-conductivity-type region has an impurity concentration higher than said first second-conductivity-type region.

14. A solid-state image sensing device, according to claim 10, wherein:
said second second-conductivity type region has an impurity concentration lower than said second-conductivity-type device separation region.

15. A solid-state image sensing device, according to claim 11, wherein:
said second second-conductivity-type region has an impurity concentration lower than said second-conductivity-type device separation region.

16. A solid-state image sensing device, according to claim 10, wherein:
said second second-conductivity-type region is formed by ion implantation, and part of said ion-implanted second second-conductivity-type region is formed overlapping with part of ion-implanted region provided for said first second conductivity-type region.

17. A solid-state image sensing device, according to claim 11, wherein:
said second second-conductivity-type region is formed by ion implantation, and part of said ion-implanted second second-conductivity-type region is formed overlapping with part of ion-implanted region provided for said first second conductivity-type region.

18. A solid-state image sensing device, according to claim 10, wherein:
said partially shallow second second-conductivity-type region is formed by diffusion in the lateral direction.

19. A solid-state image sensing device, according to claim 11, wherein:
said partially shallow second second-conductivity-type region is formed by diffusion in the lateral direction.

20. A solid-state image sensing device, according to claim 10, wherein:
said partially shallow second second-conductivity-type region is formed by ion implantation in the direction inclined from the normal line of substrate surface.

21. A solid-state image sensing device, according to claim 11, wherein:
said partially shallow second second-conductivity-type region is formed by ion implantation in the direction inclined from the normal line of substrate surface.

22. A solid-state image sensing device, according to claim 10, wherein:
said second second-conductivity-type region is formed by ion implantation using $BF_2$, Ga or In.

23. A solid-state image sensing device, according to claim 11, wherein:
said second second-conductivity-type region is formed by ion implantation using $BF_2$, Ga or In.

* * * * *